(12) United States Patent
Akiyama et al.

(10) Patent No.: US 8,878,860 B2
(45) Date of Patent: Nov. 4, 2014

(54) ACCESSING MEMORY USING MULTI-TILING

(75) Inventors: James Akiyama, Beaverton, OR (US); William H. Clifford, Gig Harbor, WA (US)

(73) Assignee: Intel Corporation, Santa Clara, CA (US)

( * ) Notice: Subject to any disclaimer, the term of this patent is extended or adjusted under 35 U.S.C. 154(b) by 1018 days.

(21) Appl. No.: 11/648,469

(22) Filed: Dec. 28, 2006

(65) Prior Publication Data

US 2008/0162802 A1  Jul. 3, 2008

(51) Int. Cl.
| | |
|---|---|
| *G06F 13/28* | (2006.01) |
| *G06F 13/16* | (2006.01) |
| *G06F 12/06* | (2006.01) |
| *G11C 11/408* | (2006.01) |
| *G11C 8/12* | (2006.01) |
| *G06F 12/02* | (2006.01) |

(52) U.S. Cl.
CPC ........ *G06F 13/1684* (2013.01); *G06F 12/0646* (2013.01); *G11C 11/4082* (2013.01); *G11C 8/12* (2013.01); *G06F 12/0207* (2013.01); *G09G 2360/122* (2013.01); *G09G 2360/123* (2013.01)
USPC ........... 345/533; 345/542; 345/544; 345/564; 711/118; 711/154; 711/157; 711/149

(58) Field of Classification Search
CPC ............ G06F 12/0646; G06F 13/1684; G11C 11/4082; G11C 8/12
USPC ............................ 345/530, 542; 711/118, 154
See application file for complete search history.

(56) References Cited

U.S. PATENT DOCUMENTS

| | | | |
|---|---|---|---|
| 3,323,109 | A | 5/1967 | Hect et al. |
| 3,988,717 | A | 10/1976 | Kisylia |
| 4,051,461 | A | 9/1977 | Hashimoto et al. |
| 4,059,850 | A | 11/1977 | Van Eck et al. |

(Continued)

FOREIGN PATENT DOCUMENTS

| | | |
|---|---|---|
| DE | 3689276 | 5/2000 |
| DE | 10216611 | 11/2003 |

(Continued)

OTHER PUBLICATIONS

Imagination Technologies, "POWERVR MBX—Technology Overview", Version 1.5f, May 6, 2009, Copyright 2009 Imagination Technologies Ltd., 17 pages.

(Continued)

*Primary Examiner* — Jin-Cheng Wang
(74) *Attorney, Agent, or Firm* — Blakely, Sokoloff, Taylor & Zafman LLP

(57) ABSTRACT

An embodiment of the present invention is a technique to control memory access. An address pre-swizzle circuit conditions address bits provided by a processor according to access control signals. A data steering circuit connects to N sub-channels of memory to dynamically steer data for a memory access type including tiled and untiled memory accesses according to the access control signals, the conditioned address bits, and sub-channel identifiers associated with the N sub-channels. The tiled memory access includes horizontally and vertically tiled memory accesses. An address post-swizzle circuit generates sub-channel address bits to the N sub-channels using the conditioned address bits and according to the access control signals and the sub-channel identifiers.

15 Claims, 16 Drawing Sheets

(56) References Cited

U.S. PATENT DOCUMENTS

| | | | |
|---|---|---|---|
| 4,096,570 A | 6/1978 | Ishibashi et al. | |
| 4,124,891 A | 11/1978 | Weller et al. | |
| 4,320,456 A | 3/1982 | Heise et al. | |
| 4,495,570 A | 1/1985 | Kitajima et al. | |
| 4,504,902 A | 3/1985 | Gallaher et al. | |
| 4,797,850 A | 1/1989 | Amitai | |
| 4,999,620 A | 3/1991 | Ishii | |
| 5,034,917 A | 7/1991 | Bland et al. | |
| 5,097,437 A | 3/1992 | Larson | |
| 5,142,627 A | 8/1992 | Elliot et al. | |
| 5,251,310 A | 10/1993 | Smelser et al. | |
| 5,270,973 A | 12/1993 | Guillemaud et al. | |
| 5,325,510 A | 6/1994 | Frazier | |
| 5,412,613 A | 5/1995 | Galbi et al. | |
| 5,412,662 A | 5/1995 | Honma et al. | |
| 5,459,842 A | 10/1995 | Begun et al. | |
| 5,504,875 A | 4/1996 | Mills et al. | |
| 5,522,082 A | 5/1996 | Guttag et al. | |
| 5,526,507 A | 6/1996 | Hill | |
| 5,606,347 A | 2/1997 | Simpson | |
| 5,649,157 A | 7/1997 | Williams | |
| 5,654,742 A | 8/1997 | Priem et al. | |
| 5,710,550 A | 1/1998 | Hsieh et al. | |
| 5,748,554 A | 5/1998 | Barth et al. | |
| 5,752,045 A | 5/1998 | Chen et al. | |
| 5,761,708 A | 6/1998 | Cherabuddi et al. | |
| 5,768,584 A | 6/1998 | MacDonald et al. | |
| 5,781,200 A | 7/1998 | Lu et al. | |
| 5,781,926 A | 7/1998 | Gaskins et al. | |
| RE36,052 E | 1/1999 | Kobayashi et al. | |
| 5,875,470 A | 2/1999 | Dreibelbis et al. | |
| 5,901,332 A | 5/1999 | Gephardt et al. | |
| 5,913,044 A | 6/1999 | Tran et al. | |
| 5,949,736 A | 9/1999 | Sugita | |
| 5,995,405 A | 11/1999 | Trick | |
| 6,003,121 A | 12/1999 | Wirt | |
| 6,067,593 A | 5/2000 | Schade | |
| 6,076,139 A | 6/2000 | Welker et al. | |
| 6,405,273 B1 | 6/2002 | Fleck et al. | |
| 6,502,161 B1 | 12/2002 | Perego et al. | |
| 6,549,483 B2 | 4/2003 | Kurjanowicz et al. | |
| 6,643,746 B1 | 11/2003 | Bouquet | |
| 6,658,553 B1 | 12/2003 | Ding et al. | |
| 6,798,679 B2 | 9/2004 | Matsumoto et al. | |
| 6,839,266 B1 | 1/2005 | Garrett et al. | |
| 6,853,557 B1 | 2/2005 | Haba et al. | |
| 6,948,014 B2 | 9/2005 | Dietrich et al. | |
| 6,999,088 B1 | 2/2006 | VanDyke et al. | |
| 6,999,091 B2 | 2/2006 | Saxena et al. | |
| 7,043,617 B2 | 5/2006 | Wiliams | |
| 7,765,366 B2 | 7/2010 | Akiyama et al. | |
| 8,032,688 B2 | 10/2011 | MacWilliams et al. | |
| 8,200,883 B2 | 6/2012 | MacWilliams et al. | |
| 8,253,751 B2 | 8/2012 | McWilliams et al. | |
| 2001/0043500 A1 | 11/2001 | Otsuka et al. | |
| 2002/0078268 A1 | 6/2002 | Lasserre | |
| 2002/0083266 A1 | 6/2002 | Reuter | |
| 2002/0083292 A1 | 6/2002 | Isomura et al. | |
| 2002/0188858 A1 | 12/2002 | Oerlemans | |
| 2003/0056058 A1 | 3/2003 | Veitch | |
| 2003/0142102 A1 | 7/2003 | Emberling et al. | |
| 2003/0179598 A1 | 9/2003 | Chen | |
| 2003/0191915 A1 | 10/2003 | Saxena et al. | |
| 2003/0204679 A1 | 10/2003 | Blankenship | |
| 2003/0218216 A1 | 11/2003 | Matsumoto | |
| 2003/0225970 A1 | 12/2003 | Hashemi | |
| 2003/0229821 A1 | 12/2003 | Ma | |
| 2004/0044857 A1 | 3/2004 | Jeddeloh et al. | |
| 2004/0078532 A1 | 4/2004 | Tremaine | |
| 2004/0142102 A1 | 7/2004 | Banerjee et al. | |
| 2004/0193829 A1 | 9/2004 | Woo et al. | |
| 2004/0228165 A1 | 11/2004 | Kim et al. | |
| 2005/0012759 A1 | 1/2005 | Valmiki et al. | |
| 2005/0021924 A1 | 1/2005 | Bergen et al. | |
| 2005/0024369 A1 | 2/2005 | Xie | |
| 2005/0068844 A1 | 3/2005 | Roohparvar | |
| 2005/0080953 A1 | 4/2005 | Oner et al. | |
| 2005/0193293 A1 | 9/2005 | Shikata | |
| 2005/0281220 A1 | 12/2005 | Stanwood et al. | |
| 2006/0248489 A1 | 11/2006 | Ruf | |
| 2006/0294264 A1 | 12/2006 | Akiyama et al. | |
| 2006/0294325 A1* | 12/2006 | Akiyama et al. | 711/154 |
| 2006/0294328 A1 | 12/2006 | Akiyama et al. | |
| 2007/0002668 A1 | 1/2007 | Williams et al. | |
| 2007/0005890 A1* | 1/2007 | Gabel et al. | 711/118 |
| 2007/0008328 A1* | 1/2007 | MacWilliams et al. | 345/530 |
| 2007/0013704 A1* | 1/2007 | MacWilliams et al. | 345/542 |
| 2007/0073974 A1 | 3/2007 | Averill et al. | |

FOREIGN PATENT DOCUMENTS

| | | |
|---|---|---|
| EP | 0 188 828 A2 | 7/1996 |
| EP | 1 001 347 A2 | 5/2000 |
| EP | 1 001 347 A3 | 4/2003 |
| EP | 2 006 858 A3 | 1/2009 |
| EP | 1 896 964 B1 | 5/2011 |
| EP | 2 006 775 B1 | 5/2011 |
| EP | 2 006 858 B1 | 6/2011 |
| EP | 1 896 963 B1 | 1/2013 |
| JP | 06095959 | 4/1994 |
| JP | 10162157 | 6/1998 |
| TW | 529032 | 4/2003 |
| WO | WO 2007/005891 A2 | 1/2007 |

OTHER PUBLICATIONS

Foreign counterpart PCT Search Report, Application No. PCT/US2007/089170, International Preliminary Report on Patentability, mailed Jul. 9, 2009, 6 pages.

Office Action from foreign counterpart China Patent Application No. 200710307341.3, mailed Oct. 16, 2009, 12 pages. (Translation included).

Second Office Action from foreign counterpart China Patent Application No. 200710307341.3, mailed Jun. 29, 2010, 16 pages.

Supplementary European Search Report from counterpart European Patent Application EP 07 87 0100, Mailed Jun. 29, 2010, 3 pages.

International Search Report and Written Opinion of the International Searching Authority Dated Apr. 24, 2008, International Application No. PCT/US2007/089170.

Machine translation of Japan publication JP10-162157, 2008.

International Search Report from PCT Application No. US2006/026072, mailed Feb. 26, 2007, 4 pages.

Written Opinion from PCT Application No. US2006/026072, mailed Feb. 26, 2007, 7 pages.

International Preliminary Report on Patentability from PCT Application No. US2006/026072, mailed Jan. 17, 2008, 9 pages.

Notice of Allowance from U.S. Appl. No. 13/114,903, mailed Feb. 13, 2012, 5 pages.

Notice of Allowance from U.S. Appl. No. 11/174,134, mailed May 26, 2011, 9 pages.

Communication from EP Application No. 08016184.7, mailed Mar. 16, 2009, 8 pages.

European Search Report from EP Application No. 08016184.7, mailed Dec. 15, 2008, 3 pages.

European Search Report from EP Application No. 08016185.4, mailed Dec. 15, 2008, 6 pages.

Decision to Grant from Japanese Patent Application No. 2008-519708 with English Translation of Granted Claims dated Aug. 4, 2011, 8 pages.

Patent Certificate for Invention and Allowed Claims for Chinese Patent No. ZL 200610136320.5, Jun. 6, 2012, 9 pages.

Letters Patent and Allowed Claims for Taiwan Invention Patent No. I360751, Mar. 21, 2012, 9 pages.

Official Letter and Search Report from Taiwan Patent Application No. 95123833, dated Jun. 29, 2009, 5 pages.

Certificate of Patent and Allowed Claims for Korean Patent No. 10-1054640, Jul. 29, 2011, 8 pages.

PCT International Preliminary Report on Patentability and Written Opinion for Application No. PCT/US2007/089170, mailed Jul. 9, 2009, 5 pages.

(56) References Cited

OTHER PUBLICATIONS

Office Action from foreign counterpart China Patent Application No. 200710307341.3, mailed May 6, 2011, 11 pages. (Translation Included).

Office Action from foreign counterpart China Patent Application No. 200710307341.3, mailed Feb. 3, 2012, 9 pages. (Translation included).

Patent Abstract including allowed claims from foreign counterpart China Patent Application No. 200710307341.3, Granted on Dec. 12, 2012, 8 pages).

Granted Application from foreign counterpart Taiwan Patent Application No. 96147366, Granted Dec. 11, 2012, 20 pages (Claims Translation included).

Office Action from foreign counterpart European Patent Application No. 08 870 100.1-1229, mailed Sep. 28, 2010, 8 pages.

Office Action from foreign counterpart European Patent Application No. 08 870 100.1-1229, mailed Dec. 13, 2012, 5 pages.

Office Action from foreign counterpart European Patent Application No. 08 870 100.1-1229, mailed Oct. 4, 2013, 4 pages.

Patent Abstract including allowed claims from foreign counterpart Japanese Patent Application No. JP20090544315, Granted on Feb. 10, 2012, 11 pages (Translation included).

Patent Abstract including allowed claims from foreign counterpart Japanese Patent Application No. JP20120026518, Granted on Oct. 25, 2013, 5 pages (Translation included).

Notice of Allowance from related U.S. Appl. No. 13/588,995, mailed Feb. 14, 2014, 11 pages, including allowed claims.

Srikanth, "Cache Memory", http:web.archive.org/web20000713053339/:www.newton.dep.anl.gov/askasci/com, date Jun. 19, 2009, 2 pages.

"IA-32 Intel Architecture Software Developer's Manual", vol. 3: System Programming Guide, 4 pages, 2001.

Webopedia, "Main Memory", http://www.webopedia.com/TERM/m/main_memory.html, Jan. 15, 2002, pp. 1-4.

* cited by examiner

ACCESSING MEMORY USING MULTI-TILING

BACKGROUND

1. Field of the Invention

Embodiments of the invention relate to the field of microprocessors, and more specifically, to memory organization.

2. Description of the Invention

In a typical processor system, memory is usually organized as a linearly addressed array of storage elements. This organization is suitable for code or program storage because instructions in a program are executed sequentially. For storage of certain types of data or for certain memory operations, the linear organization may be inefficient.

It may be desirable in many applications that the memory is organized according to the data structures operated on by the specific application. For example, in graphics and imaging applications, the basic data structure is a two-dimensional (2-D) array. In addition to providing the basic data blocks, 2-D arrays may also be used to construct multi-dimensional arrays. Accessing a 2-D array using the existing memory organization may incur processing overheads that cause inefficiency. In addition, screen refresh typically operates on a scan line at a time, and thus benefits when memory organization is more linear.

BRIEF DESCRIPTION OF THE DRAWINGS

Embodiments of the invention may best be understood by referring to the following description and accompanying drawings that are used to illustrate embodiments of the invention. In the drawings.

DESCRIPTION

An embodiment of the present invention is a technique to control memory access. A data steering circuit connects to N sub-channels of memory to dynamically steer data for a memory access type including tiled and untiled memory accesses according to access control signals and sub-channel identifiers associated with the N sub-channels. The tiled memory access includes horizontally and vertically tiled memory accesses. An address pre-swizzle circuit conditions the address lines for a particular type of access. The data steering circuit is configured according to the access control signals and the conditioned address bits. Address post-swizzle circuits generate sub-channel address bits to the N sub-channels according to the access control signals and the sub-channel identifiers.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process, which is usually depicted as a flowchart, a flow diagram, a structure diagram, or a block diagram. Although a flowchart may describe the operations as a sequential process, many of the operations can be performed in parallel or concurrently. A loop or iterations in a flowchart may be described by a single iteration. It is understood that a loop index or loop indices or counter or counters are maintained to update the associated counters or pointers. In addition, the order of the operations may be re-arranged. A process terminates when its operations are completed. A process may correspond to a method, a program, a procedure, etc. A block diagram may contain blocks or modules that describe an element, an item, a component, a device, a unit, a subunit, a structure, a method, a process, a function, an operation, a functionality, or a task, etc. A functionality or an operation may be performed automatically or manually.

Figure 1A:
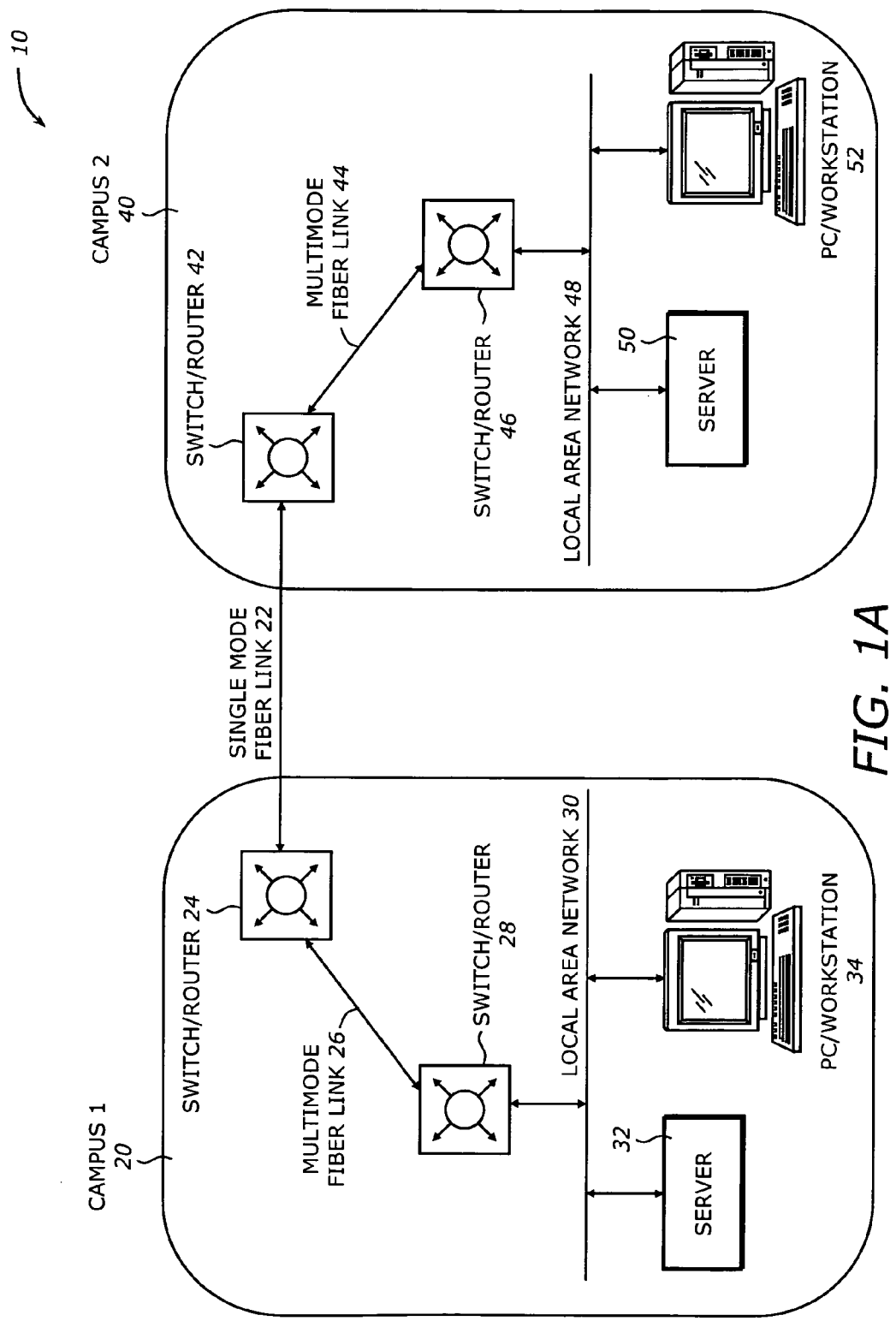
FIG. 1A is a diagram illustrating a system in which one embodiment of the invention can be practiced.

FIG. 1A is a diagram illustrating a system 10 in which one embodiment of the invention can be practiced. The system 10 represents a Local Area Network (LAN) applications using 10 Gigabit Ethernet. The system 10 includes two campuses 20 and 40 and link 22.

Each of the campuses 20 and 40 represents an enterprise using network interconnections to link personal computers (PCs), workstations, and servers. They may have aggregation of multiple 1000BASE-X or 1000BASE-T segments into 10 Gigabit Ethernet downlinks. The link 22 may be a single mode fiber link that connects the two campuses 20 and 40 over a long distance (e.g., 40 km). The transmission of packets or data may be performed with error correction using error correction codes such as the Reed-Solomon code.

Campuses 20 and 40 may be similar in their infrastructure. The network in each campus may encompass buildings, data centers, or computer rooms. The campus 20 may include switches/routers, such as switch/router 24 and switch/router 28, and a LAN 30. The campus 40 may include switches/routers, such as switch/router 42 and switch/router 46, and a LAN 48. Switch/routers 24 and 42 are typically located at the edge of the corresponding campuses. They are connected together via the link 22. Switches/routers 24 and 28 are connected via a multimode fiber link 26 over shorter distances (e.g., 30-80 meters) at speed of up to 10 Gigabits per second (Gbps). The switch/router 28 is connected to the LAN 30. Similarly, switches/routers 42 and 46 are connected via a multimode fiber link 44 over shorter distances (e.g., 30-80 meters) at speed of up to 10 Gigabits per second (Gbps). The switch/router 46 is connected to the LAN 48.

The LAN 30 provides connectivity to servers, PCs, or workstations, such as a server 32 and a personal computer (PC)/workstation 34. Similarly, the LAN 48 provides network connectivity to servers, PCs, or workstations, such as a server 50 and a PC/workstation 52. The server 32 or 50 provides specific operations to support the computing environment. They may be a print server connected to a variety of printers, a storage server connected to mass storage devices such as tape drive, redundant arrays of inexpensive disks (RAIDs), a media server to provide multimedia services such as video, audio, or graphics, or any server with specific functions. Each server typically includes one or more network interface cards (NICs) with network connectivity to the corresponding LAN.

Figure 1B:
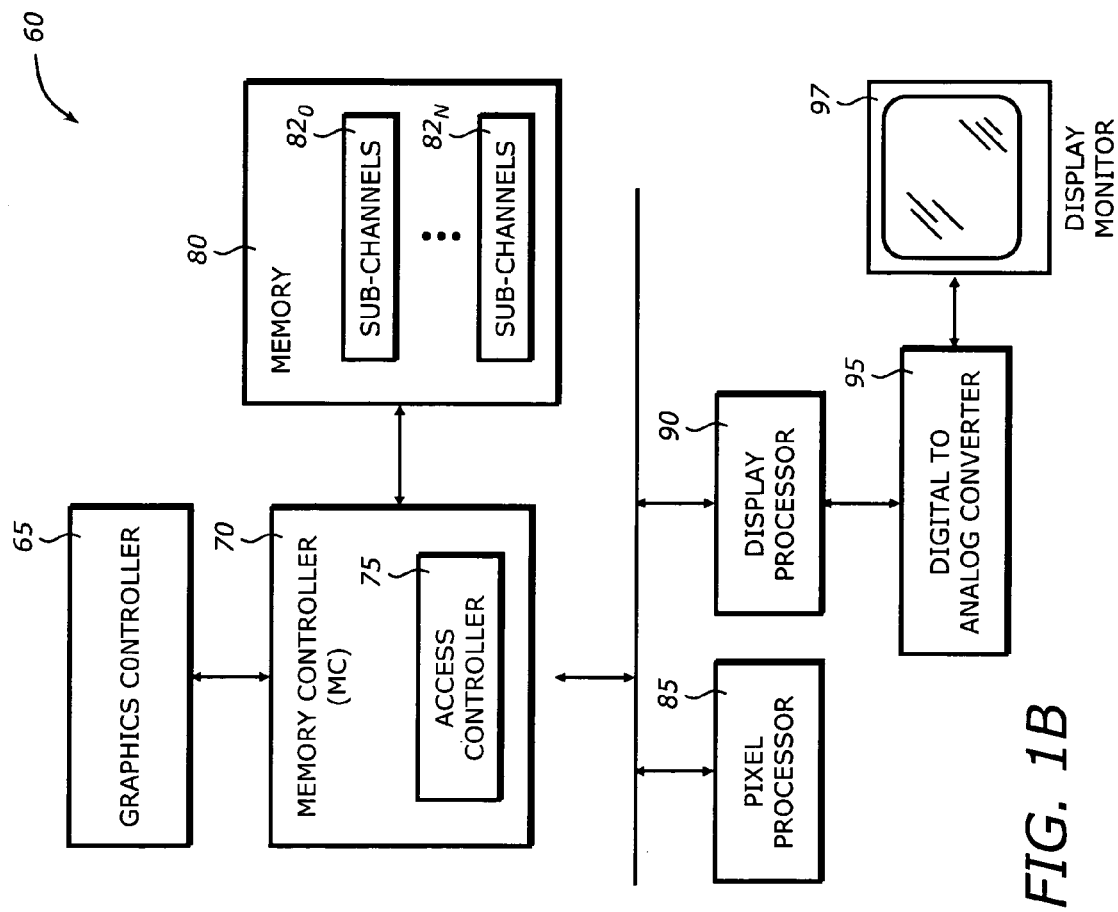
FIG. 1B is a diagram illustrating a graphic system according to one embodiment of the invention.

FIG. 1B is a diagram illustrating a graphics system 60 in which one embodiment of the invention can be practiced. The graphics system 60 includes a graphics controller 65, a memory controller 70, a memory 80, a pixel processor 85, a display processor 90, a digital-to-analog converter (DAC) 95, and a display monitor 97.

The graphics controller 60 is any processor that has graphic capabilities to perform graphics operations such as fast line drawing, two-dimensional (2-D) and three-dimensional (3-D) graphic rendering functions, shading, anti-aliasing, polygon rendering, transparency effect, color space conversion, alpha-blending, chroma-keying, etc. The memory controller (MC) 70 performs memory control functions and may contain an access controller 75 to control memory access. The access controller 75 provides access control to the memory 80 including tiled and untiled memory accesses. The memory 80 includes SRAM or DRAM memory devices. The memory devices may be organized into N sub-channels $82_0$ to $82_N$. The sub-channels $82_0$ to $82_N$ may interface to the access controller 75. The memory devices store graphic data processed by the graphic controller 60.

The pixel processor 85 is a specialized graphic engine that can perform specific and complex graphic functions such as geometry calculations, affine conversions, model view projections, 3-D clipping, etc. The pixel processor 85 is also interfaced to the memory controller 70 to access the memory 80 and/or the graphic controller 65. The display processor 90 processes displaying the graphic data and performs display-related functions such as palette table look-up, synchronization, backlight controller, video processing, etc. The DAC 95 converts digital display digital data to analog video signal to the display monitor 97. The display monitor 97 is any display monitor that displays the graphic information on the screen for viewing. The display monitor may be a Cathode Ray Tube (CRT) monitor, a television (TV) set, a Liquid Crystal Display (LCD), a Flat Panel, or a Digital CRT.

Figure 1C:
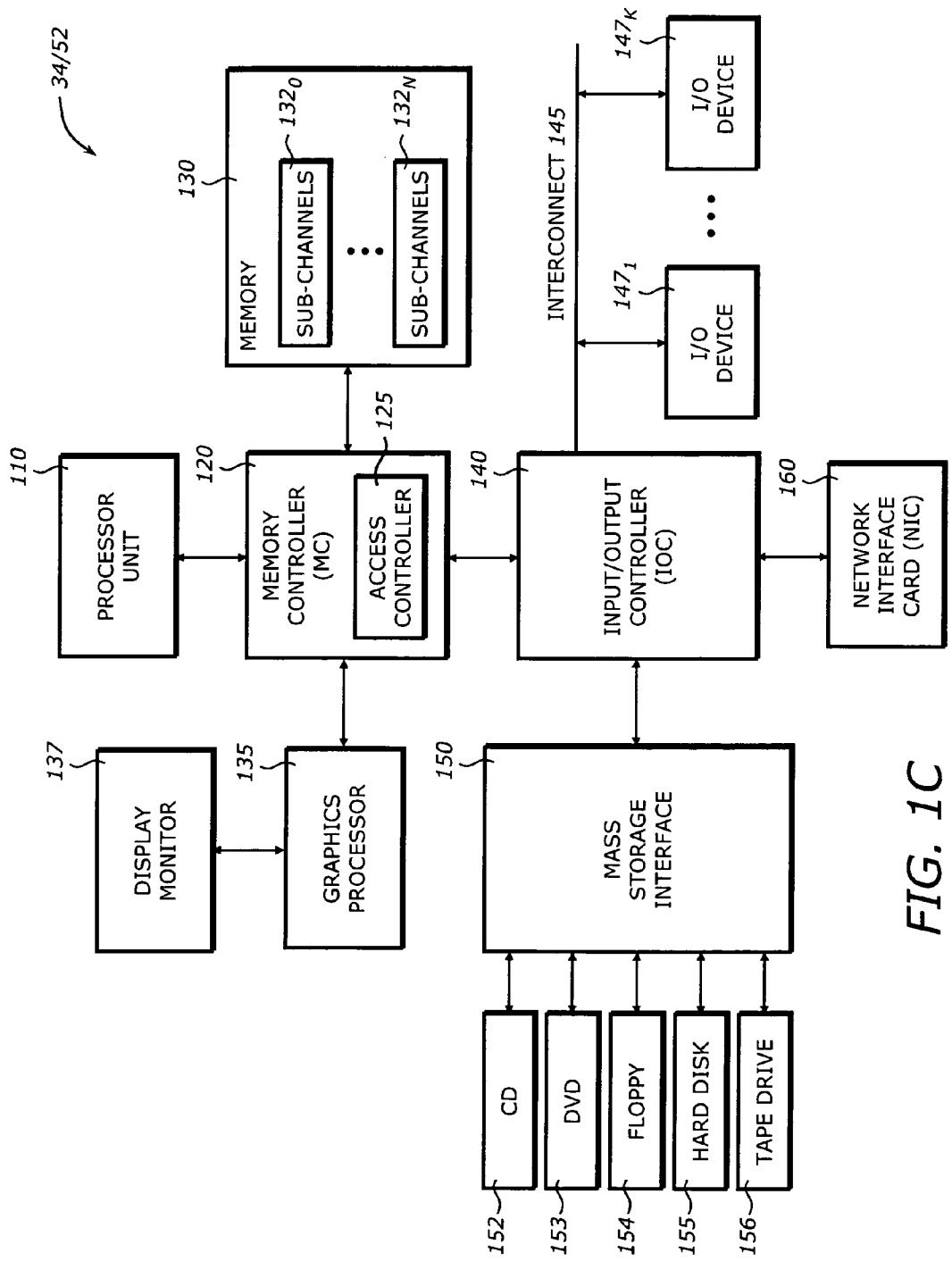
FIG. 1C is a diagram illustrating a server/computer system according to one embodiment of the invention.

FIG. 1C is a diagram illustrating the workstation 34/52 in which one embodiment of the invention can be practiced. The workstation 34/52 may include a processor unit 110, a memory controller (MC) 120, a memory 130, an input/output controller (IOC) 140, an interconnect 145, a mass storage interface 150, input/output (I/O) devices $147_1$ to $147_K$, and a network interface card (NIC) 160. The workstation 34/52 may include more or less of the above components.

The processor unit 110 represents a central processing unit of any type of architecture, such as processors using hyper threading, security, network, digital media technologies, single-core processors, multi-core processors, embedded processors, mobile processors, micro-controllers, digital signal processors, superscalar computers, vector processors, single instruction multiple data (SAD) computers, complex instruction set computers (CISC), reduced instruction set computers (RISC), very long instruction word (VLIW), or hybrid architecture.

The MC 120 provides control and configuration of memory and input/output devices such as the memory 130 and the IOC 140. The MC 120 may be integrated into a chipset that integrates multiple functionalities such as graphics, media, isolated execution mode, host-to-peripheral bus interface, memory control, power management, etc. The MC 120 or the memory controller functionality in the MC 120 may be integrated in the processor unit 110. In some embodiments, the memory controller, either internal or external to the processor unit 110, may work for all cores or processors in the processor unit 110. In other embodiments, it may include different portions that may work separately for different cores or processors in the processor unit 110. The MC 120 may include an access controller 125 to control access to the memory 130. The access controller 125 may allow dynamic configuration of a memory access into tiled and untiled memory accesses.

The memory 130 stores system code and data. The memory 130 is typically implemented with dynamic random access memory (DRAM), static random access memory (SRAM), or any other types of memories including those that do not need to be refreshed. The main memory 130 may include multiple channels of memory devices such as DRAMs similar to those used in the memory 80 shown in FIG. 1B. The DRAMs may include memory devices with a bandwidth of 8.5 Gigabyte per second (GB/s). The DRAMs may be Synchronous DRAM (SDRAM), Single Data Rate (SDR) SDRAM, Extended Data Out (EDO) DRAM, Double Data Rate (DDR) SDRAM, Double Data Rate Two (DDR2) SDRAM, Rambus DRAM (RDRAM R), Extreme Data Rate (XDR), or XDR II. RDRAM and XDR are registered trademarks of Rambus. The DDR doubles transfer rates by transferring data on both the rising and falling edges of the clock and may be packaged in a Dual In Line Memory Module (DIMM). This effectively doubles the transfer rate without increasing the frequency of the front side bus (FSB). The DDR2 increases the data rates using various techniques such as on-die termination to eliminate excess signal noise on the chip, pre-fetch buffers, and off-chip drivers. The off-chip drivers may use calibration techniques to calibrate the differential data strobes against each other. Through the calibration, the ramping voltages are optimized for the buffer impedances to reduce over- and under-shooting at the rising and falling edges. The XDR or XDR II uses Differential Rambus Signaling Levels (DRSL) for scalable high speed point-to-point bidirectional data signals and Rambus Signaling Level (RSL) for source synchronous bussed address and command signals to multiple deices. The memory devices used in the memory 130 may operate at any suitable clock frequency, such as 100 MHz, 133 MHz, 166 MHz, 266 MHz, 333 MHz, 400 Mhz, 1 GHz, or scalable to 8 GHz. They may be packaged in any packaging technologies including Ball Grid Array (BGA), DIMM, sticks or modules. In one embodiment, the memory 130 includes N sub-channels $132_0$ to $132_N$. Each of the N sub-channels $132_0$ to $132_N$ may correspond to one or more memory devices. The N sub-channels $132_0$ to $132_N$ may interface to the access controller 125.

The graphics processor 135 is any processor that provides graphics functionalities. The graphics processor 135 may also be integrated into the MC 120 to form a Graphics and Memory Controller (GMC). The graphics processor 135 may be a graphics card such as the Graphics Performance Accelerator (AGP) card, interfaced to the MC 120 via a graphics port such as the Accelerated Graphics Port (AGP) or the PCI Express port configured for graphics controllers. The graphics processor 135 provides interface to the display monitor 137 such as standard progressive scan monitor, television (TV)-out device, and Transition Minimized Differential Signaling (TMDS) controller. The display monitor 137 may be any display device such as Cathode Ray Tube (CRT) monitor, TV set, Liquid Crystal Display (LCD), Flat Panel, and Digital CRT.

The IOC 140 has a number of functionalities that are designed to support I/O functions. The IOC 140 may also be integrated into a chipset together or separate from the MC 120 to perform I/O functions. The IOC 140 may include a number of interface and I/O functions such as peripheral component interconnect (PCI) bus interface, processor interface, interrupt controller, direct memory access (DMA) controller, power management logic, timer, system management bus (SMBus), universal serial bus (USB) interface, mass storage interface, low pin count (LPC) interface, wireless interconnect, direct media interface (DMI), etc.

The interconnect 145 provides interface to peripheral devices. The interconnect 145 may be point-to-point or connected to multiple devices. For clarity, not all interconnects are shown. It is contemplated that the interconnect 145 may include any interconnect or bus such as Peripheral Component Interconnect (PCI), PCI Express, Universal Serial Bus (USB), Small Computer System Interface (SCSI), serial SCSI, and Direct Media Interface (DMI), etc.

The mass storage interface 150 interfaces to mass storage devices to store archive information such as code, programs, files, data, and applications. The mass storage interface may include SCSI, serial SCSI, Advanced Technology Attachment (ATA) (parallel and/or serial), Integrated Drive Electronics (IDE), enhanced IDE, ATA Packet Interface (ATAPI), etc. The mass storage device may include compact disk (CD) read-only memory (ROM) 152, digital video/versatile disc (DVD) 153, floppy drive 154, and hard drive 155, tape drive 156, and any other magnetic or optic storage devices. The mass storage device provides a mechanism to read machine-accessible media.

The I/O devices $147_1$ to $147_K$ may include any I/O devices to perform I/O functions. Examples of I/O devices $147_1$ to $147_K$ include controller for input devices (e.g., keyboard, mouse, trackball, pointing device), media card (e.g., audio, video, graphic), network card, and any other peripheral controllers.

The NIC 160 provides network connectivity to the workstation 34/52. The NIC 160 may generate interrupts as part of the processing of communication transactions. In one embodiment, the NIC 160 is compatible with both 32-bit and 64-bit peripheral component interconnect (PCI) bus standards. It is typically compliant with PCI local bus revision 2.2, PCI-X local bus revision 1.0, or PCI-Express standards. There may be more than one NIC 160 in the processing system. Typically, the NIC 160 supports standard Ethernet minimum and maximum frame sizes (64 to 1518 bytes), frame format, and Institute of Electronics and Electrical Engineers (IEEE) 802.2 Local Link Control (LLC) specifications. It may also support full-duplex Gigabit Ethernet interface, frame-based flow control, and other standards defining the physical layer and data link layer of wired Ethernet. It may be support copper Gigabit Ethernet defined by IEEE 802.3ab or fiber-optic Gigabit Ethernet defined by IEEE 802.3z.

The NIC 160 may also be a host bus adapter (HBA) such as a Small Computer System Interface (SCSI) host adapter or a Fiber Channel (FC) host adapter. The SCSI host adapter may contain hardware and firmware on board to execute SCSI transactions or an adapter Basic Input/Output System (BIOS) to boot from a SCSI device or configure the SCSI host adapter. The FC host adapter may be used to interface to a Fiber Channel bus. It may operate at high speed (e.g., 2 Gbps) with auto speed negotiation with 1 Gbps Fiber Channel Storage Area Network (SANs). It may be supported by appropriate firmware or software to provide discovery, reporting, and management of local and remote HBAs with both in-band FC or out-of-band Internet Protocol (IP) support. It may have frame level multiplexing and out of order frame reassembly, on-board context cache for fabric support, and end-to-end data protection with hardware parity and cyclic redundancy code (CRC) support.

Figure 2A:
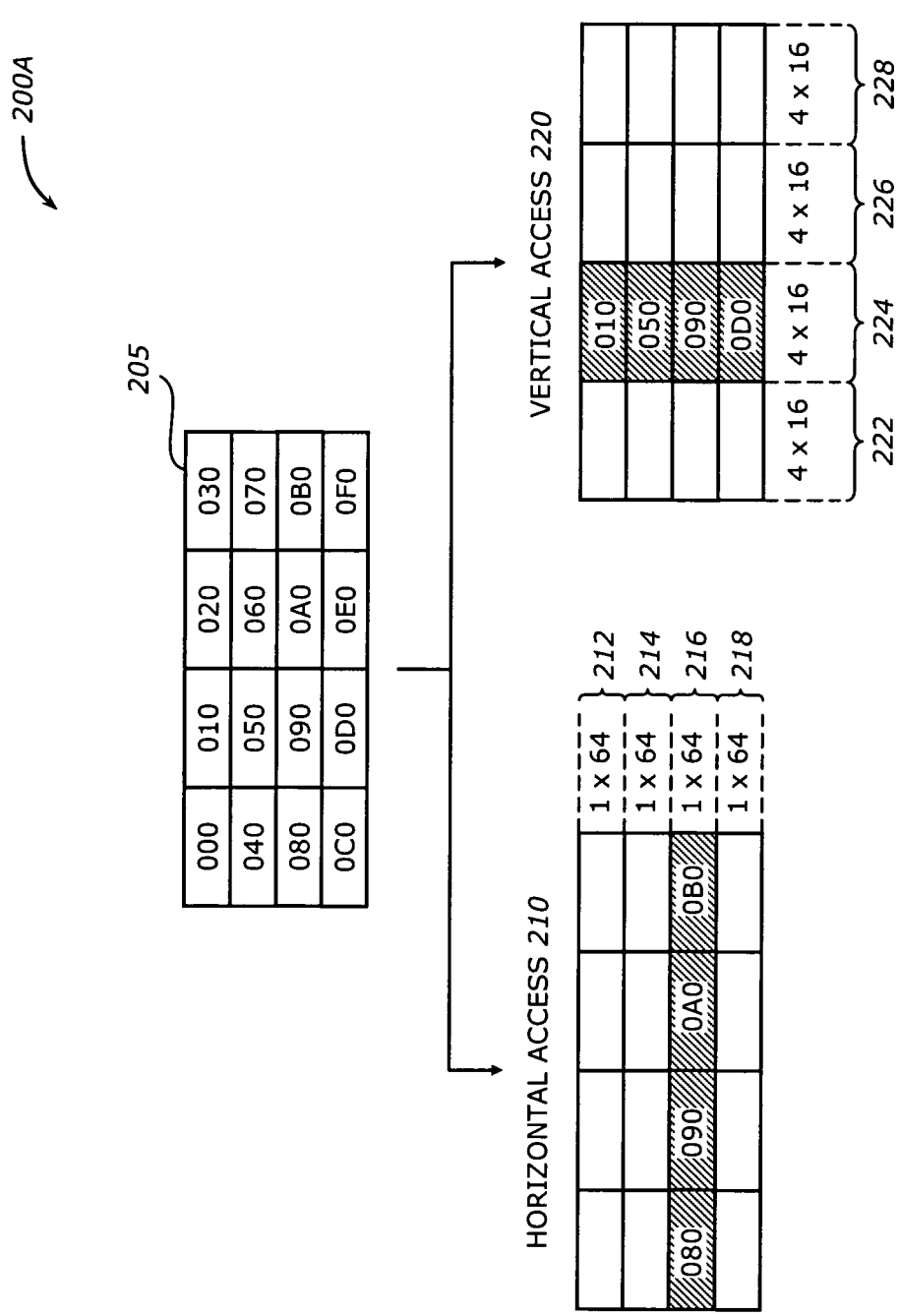
FIG. 2A is a diagram illustrating tiled memory accesses according to one embodiment of the invention.

FIG. 2A is a diagram illustrating tiled memory accesses 200A according to one embodiment of the invention. Tiled memory accesses 200A involve a rectangular region of memory 205. The rectangular region 205 is a logical representation of the memory addressing of a block of memory. It includes a number of memory blocks organized as a two-dimensional array of P columns and Q rows. In this illustrative example, P=4 and Q=4. Each of the blocks may include a number of bytes. In this example, each block contains 16 bytes. As is known by one skilled in the art, the rectangular region 205 may include any number of blocks with any number of rows and columns so long as the number of rows and columns are the same. In addition, each block may include any number of bytes.

Since memory addressing is byte-oriented, the addresses of consecutive blocks are displaced by 16 or 000010H where H denotes hexadecimal notation. In the following, the addresses are in hexadecimal. The rectangular region 205 includes 16 consecutive blocks organized as a 4×4 two-dimensional (2-D) array. This 4×4 2-D array is referred to as a tile. Suppose the address of the first block is 000, then the addresses of the next blocks are 010, 020, 030, 040, etc. as shown.

The region 205 may correspond to 64-byte memory accesses. This may correspond to four cache lines. There may be two types of memory accesses: a tiled memory access and an untiled memory access. In a typical untiled memory access, eight contiguously addressed 8-byte blocks are transferred one at a time. In the tiled memory accesses of this invention, contiguously addressed bytes are not consecutively addressed. A tiled memory access may include two types: a horizontally tiled memory access and a vertically tiled memory access. In essence, the distinction between the untiled and horizontally tiled is in how the data is distributed across the sub-channels. The byte orders of an untiled memory access are different than the byte orders of a tiled access. An application accessing a tiled region may use an untiled access as long as the byte ordering is re-ordered accordingly.

For the memory region 205, there may be two types of memory accesses: horizontal accesses 210 and vertical accesses 220. The horizontal accesses 210 include four horizontal accesses 212, 214, 216, and 218. Each horizontal access corresponds to a 1×64-byte block. The horizontal access 210 may be suitable for memory operations such as display refresh where the data representing the pixel values of a single scan line are accessed consecutively. The vertical accesses 220 include four vertical accesses 222, 224, 226, and 228. Each of the accesses corresponds to a 4×16-byte blocks. The vertical access pattern may be suitable for graphics or imaging operations such as rendering.

Figure 2B:
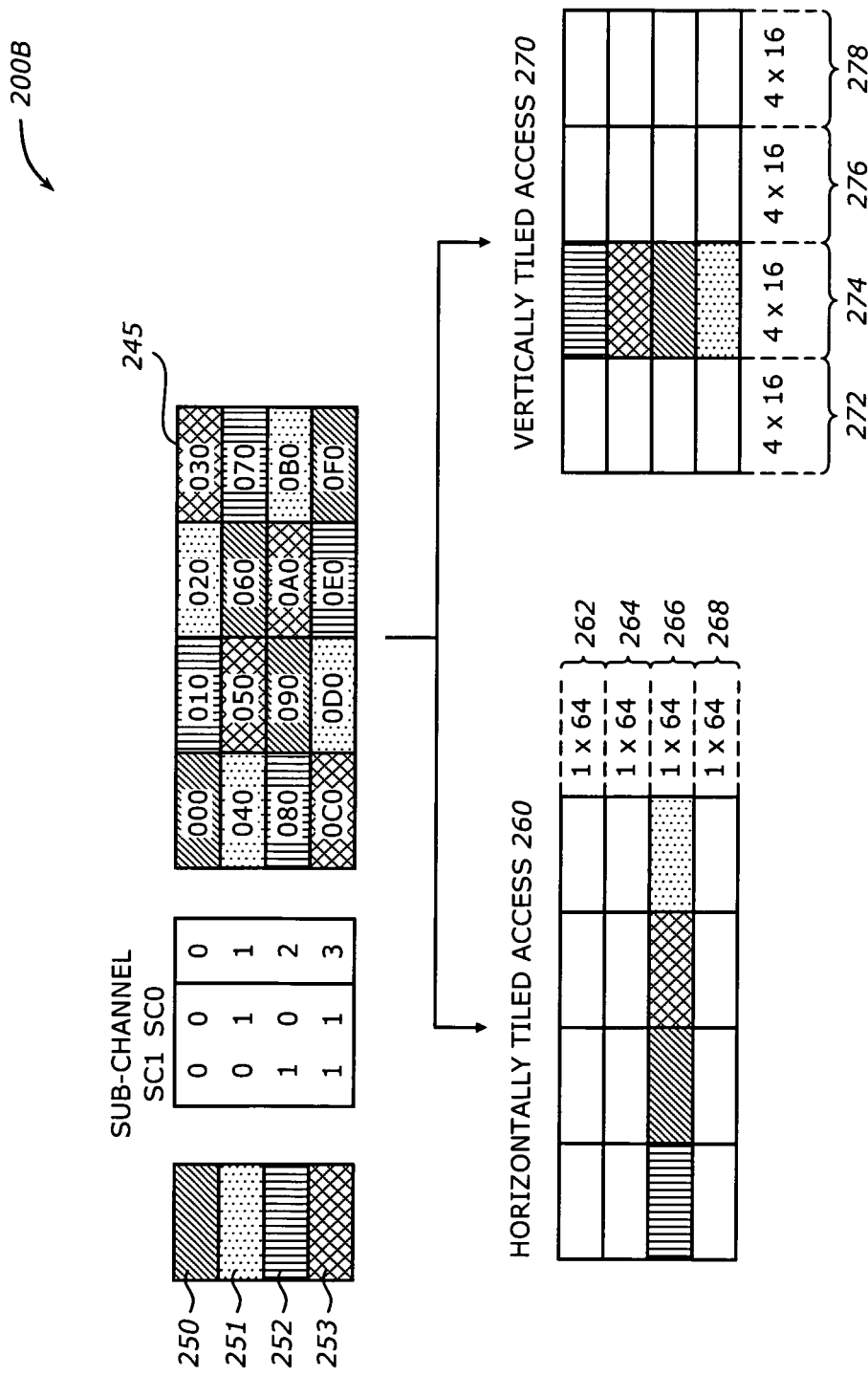
FIG. 2B is a diagram illustrating tiled memory accesses with memory sub-channels according to one embodiment of the invention.

FIG. 2B is a diagram illustrating tiled memory accesses 200B with memory sub-channels according to one embodiment of the invention. The tiled memory accesses 200B may involve a region of memory 245 and sub-channels of memory. A sub-channel is a logical division of memory devices that are assigned to correspond to a block or blocks in a tile such as the rectangular region 205. For simplicity, the rectangular region 205 may be a square region divided into N×N blocks assigned to N sub-channels 250, 251, 252, and 254. The number of physical memory devices in each sub-channel depends on the memory device organization and the size of the block in the rectangular region 205. For example, if each device is organized as 1-byte wide and each block includes 2 bytes, and there are 4×4 blocks, then there may be four sub-channels and each sub-channel may correspond to two memory devices.

The tiled region of memory 245 may be divided into 4×4 blocks. The blocks may be assigned to sub-channels such that any row or any column may contain different sub-channel assignments. Each row may contain a block of memory assigned to each sub-channel, and each column may contain a block of memory assigned to each sub-channel. In this example, the 4 sub-channels 250, 251, 252, and 253 are assigned to the blocks vertically and horizontally as shown. The tiled memory accesses 200B may include a horizontally tiled memory access 260 and a vertically tiled memory access 270. The horizontally tiled memory access 260 may include horizontally tiled memory accesses 262, 264, 266, and 268. Each of them accesses the memory blocks horizontally. Similarly, the vertically tiled memory access 270 may include vertically tiled memory accesses 272, 274, 276, and 278. Each of them accesses the memory blocks vertically.

The assignment of the sub-channels to the blocks of the tiled region of memory 245 may affect the mapping between the address bits generated from the processor 110 and the address bits at the individual sub-channels. In the following, it is assumed that the address bits generated by the processor 110 or the memory controller 120 include bits A31-A4 for a 32-bit address range and 16-byte data. As is known by one skilled in the art, any address range and any data size may be employed.

The mapping as shown in the tiled block 245 is as follows:
Sub-channel 0 is assigned to blocks 000-00F, 090-09F, 060-06F, and 0F0-0FF.
Sub-channel 1 is assigned to blocks 040-04F, 0D0-0DF, 020-02F, and 0B0-0BF.
Sub-channel 2 is assigned to blocks 080-08F, 010-01F, 0E0-0EF, and 070-07F.
Sub-channel 3 is assigned to blocks 0C0-0CF, 050-05F, 0A0-0AF, and 030-03F.

It is noted that other mappings or assignments may be used as long as each row and each column contain blocks assigned to each of the sub-channels.

The sub-channels may be identified by sub-channel identifiers. For four sub-channels, the sub-channel identifier may include 2 bits: SC1 and SC0. The sub-channel to which each 16-byte block is mapped may be a logic function of the base address of the 16-byte block. For the above mappings, one such function is the Exclusive-OR (XOR) function. Using this function, the sub-channel identifier bits may be defined as a function of the address bits A7-A4 as follows:

$$SC1 = A4 \text{ XOR } A7 \quad (1a)$$

$$SC0 = A5 \text{ XOR } A6 \quad (1b)$$

Note that these equations are applicable for the above assignment or mapping. For other assignments or mappings, there may be different equations. Alternatively, given the address bits A5-A4 and the corresponding sub-channel identifier bits SC1 and SC0, the address bits A7-A6 may be obtained. For the above assignment or mapping, address bits A7-A6 may be obtained for a vertically tiled memory access as:

$$A7 = A4 \text{ XOR } SC1 \quad (2a)$$

$$A6 = A5 \text{ XOR } SC0 \quad (2b)$$

Figure 3A:
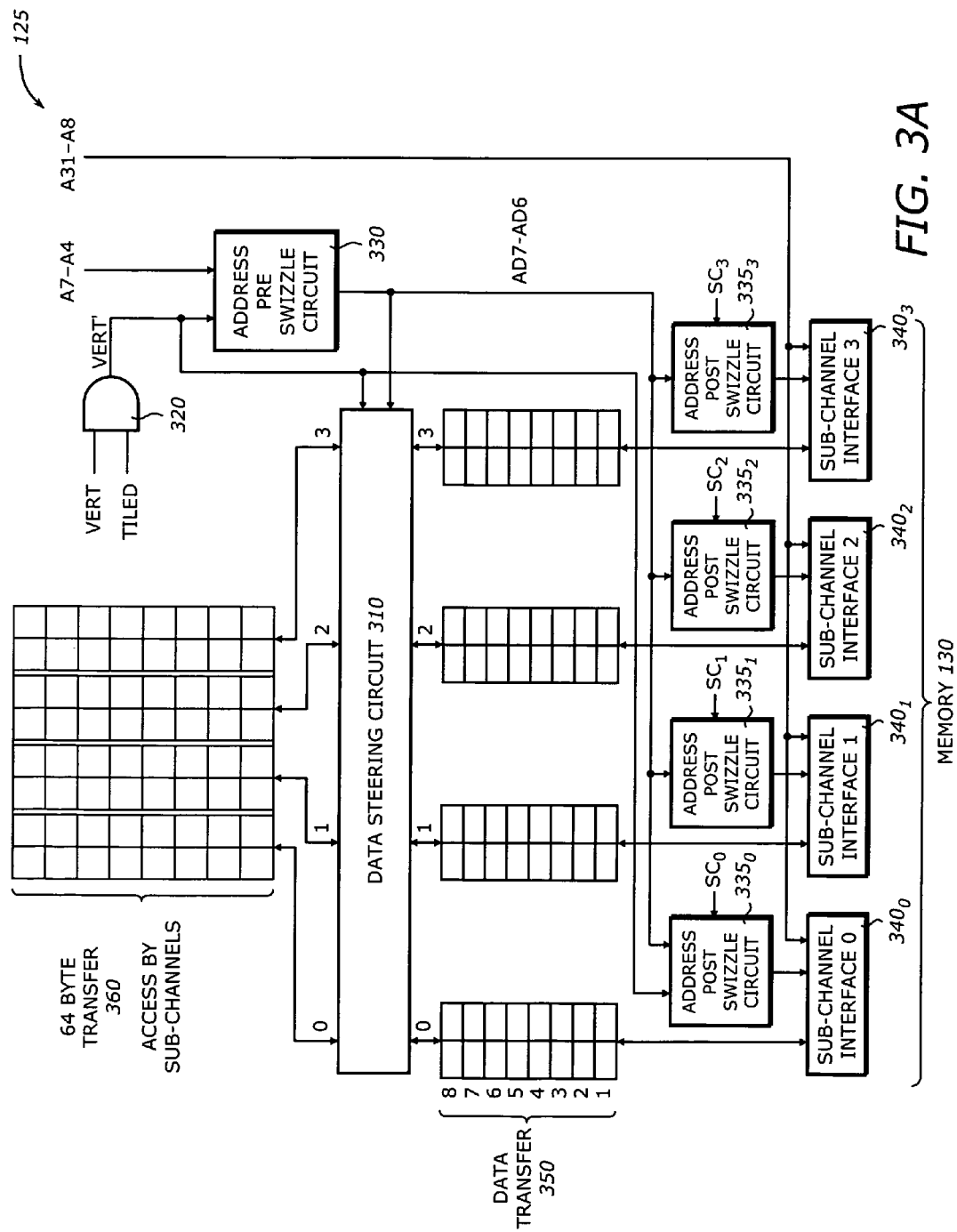
FIG. 3A is a diagram illustrating an access controller according to one embodiment of the invention.

FIG. 3A is a diagram illustrating the access controller 75/125 shown in FIG. 1B/1C according to one embodiment of the invention. The access controller 75/125 includes a data steering circuit 310, a decoding circuit 320, an address pre-swizzle circuit 330, address post-swizzle circuits $335_0$ to $335_3$, and sub-channel interfaces $340_0$ to $340_3$. For this illustrative example, it is assumed that there are eight transfers of 8 bytes each to/from the sub-channels shown as data transfer 350. These transfers correspond to 64-byte transfer 360. The address pre-swizzle circuit 330 may be inside the access controller 75/125 or in a component, external to the access controller 75/125, which requests tiled memory accesses.

For a horizontally tiled memory access or untiled memory access, the address bits A7-A6 encode the row in the tile to be accessed. For a vertically tiled memory access, the address bits A5-A4 encode the column to be accessed. The address pre-swizzle circuit 330 shows one embodiment of the specification of the column to be accessed in a vertical access. In this embodiment, the address bits A6 and A7 are replaced by the address bits A5 and A4, respectively, during a vertical access.

The tiled memory access includes horizontally and vertically tiled memory accesses as shown in FIG. 2B. The access control signals include a tiled control signal (TILED) to select the tiled memory access, and a vertical control signal (VERT) to select the vertically tiled memory access when the tiled control signal is asserted. When TILED is negated or de-asserted, VERT becomes don't cares.

The decoding circuit 320 decodes the access control signals TILED and VERT. When one of the TILED and VERT is de-asserted (e.g., to logic 0), the output of the decoding circuit 320, VERT', enables the untiled or horizontally tiled memory access mode. When both of the TILED and VERT are asserted (e.g., to logic 1), the output of the decoding circuit 320, VERT', enables the vertically tiled access mode. In one embodiment, the decoding circuit 320 may be implemented by an AND gate.

The data steering circuit 310 selects a configuration for data steering according to the access control signals. The data steering circuit 310 selects a first configuration when the memory access type is the untiled memory access, the horizontally tiled memory access, or the vertically tiled memory access having a first set of values of conditioning address bits. Conditioning address bits are the address bits used to affect the memory configuration according to the access type. For this illustrative example, the conditioning address bits are A7 and A6. The data steering circuit 310 selects one of the three configurations when the memory access type is the vertically tiled memory access which has other sets of values of the conditioning address bits.

The address post-swizzle circuits $335_0$ to $335_3$ are coupled to the N sub-channel interfaces $340_0$ to $340_3$ to generate sub-channel address bits to the N sub-channels according to the access control signals and the sub-channel identifiers. In this illustrative example, it is assumed that the address lines are A31-A6. These address bits are issued by the processor unit 110, the graphics controller 65, or the MC 70/120. The address bits A31-A8 are routed directly without modification to the memory sub-channels via the sub-channel interfaces $340_0$ to $340_3$. The address bits A7-A6 are used to generate the appropriate address bits to the individual sub-channels. The sub-channel identifier may be stored in a configuration register and is unique for each sub-channel. In one embodiment, the sub-channel identifier includes P bits where $P=\log_2(N)$ and N is the number of sub-channels. For example, when P=4 as shown in FIG. 3A, the sub-channel identifier may include 2 bits SC1 and SC0. The sub-channel interfaces $340_0$ to $340_3$ therefore are associated with the sub-channels identifier bits SC1 SC0 having values 00, 01, 10, and 11, respectively.

The sub-channel interfaces $340_0$ to $340_3$ are interfaces to the corresponding sub-channels of the memory 80/130 such as the sub-channels $82_0$ to $82_N/132_0$ to $132_3$ shown in FIG. 1B/1C. As discussed above, the sub-channels $82_0$ to $82_N/132_0$ to $132_3$ are the logical division of the memory devices in the memory 80/130 that are assigned to blocks of a tiled region of memory. Each of the sub-channel interfaces $340_0$ to $340_3$ is associated with a sub-channel identifier.

Figure 3B:
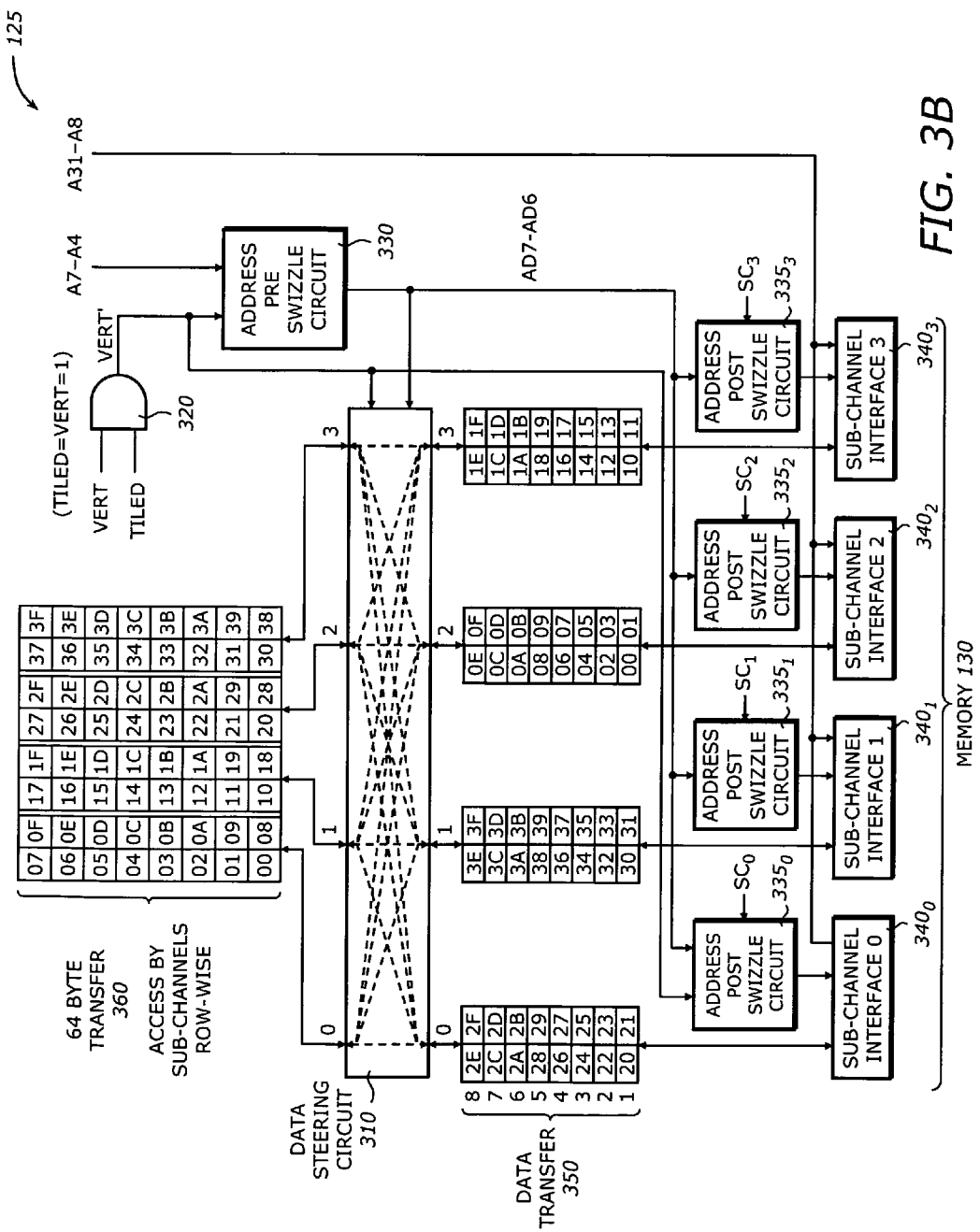
FIG. 3B is a diagram illustrating vertically tiled memory accesses using an access controller according to one embodiment of the invention.
Figure 4:
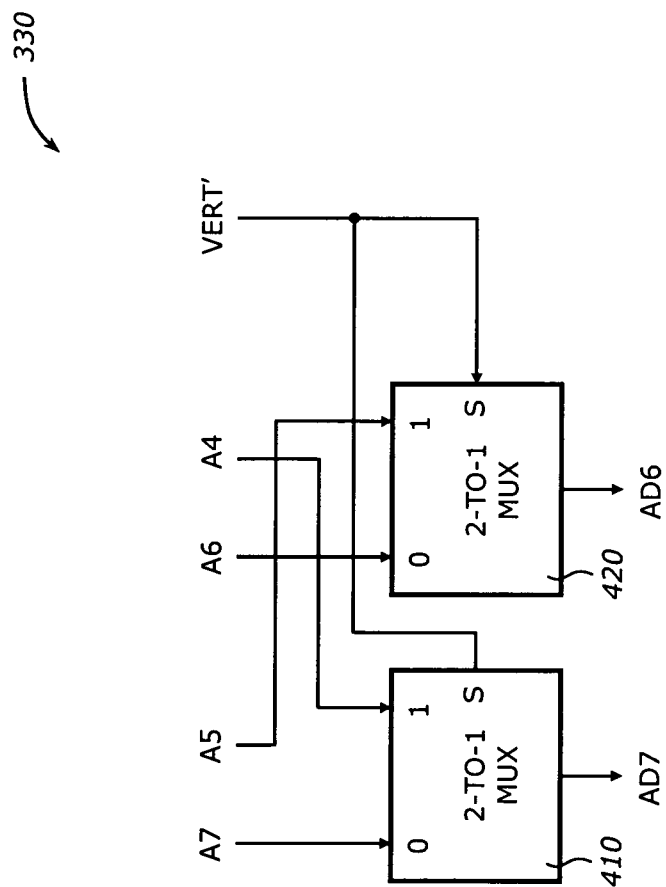
FIG. 4 is a diagram illustrating an address pre-swizzle circuit according to one embodiment of the invention.
Figure 5:
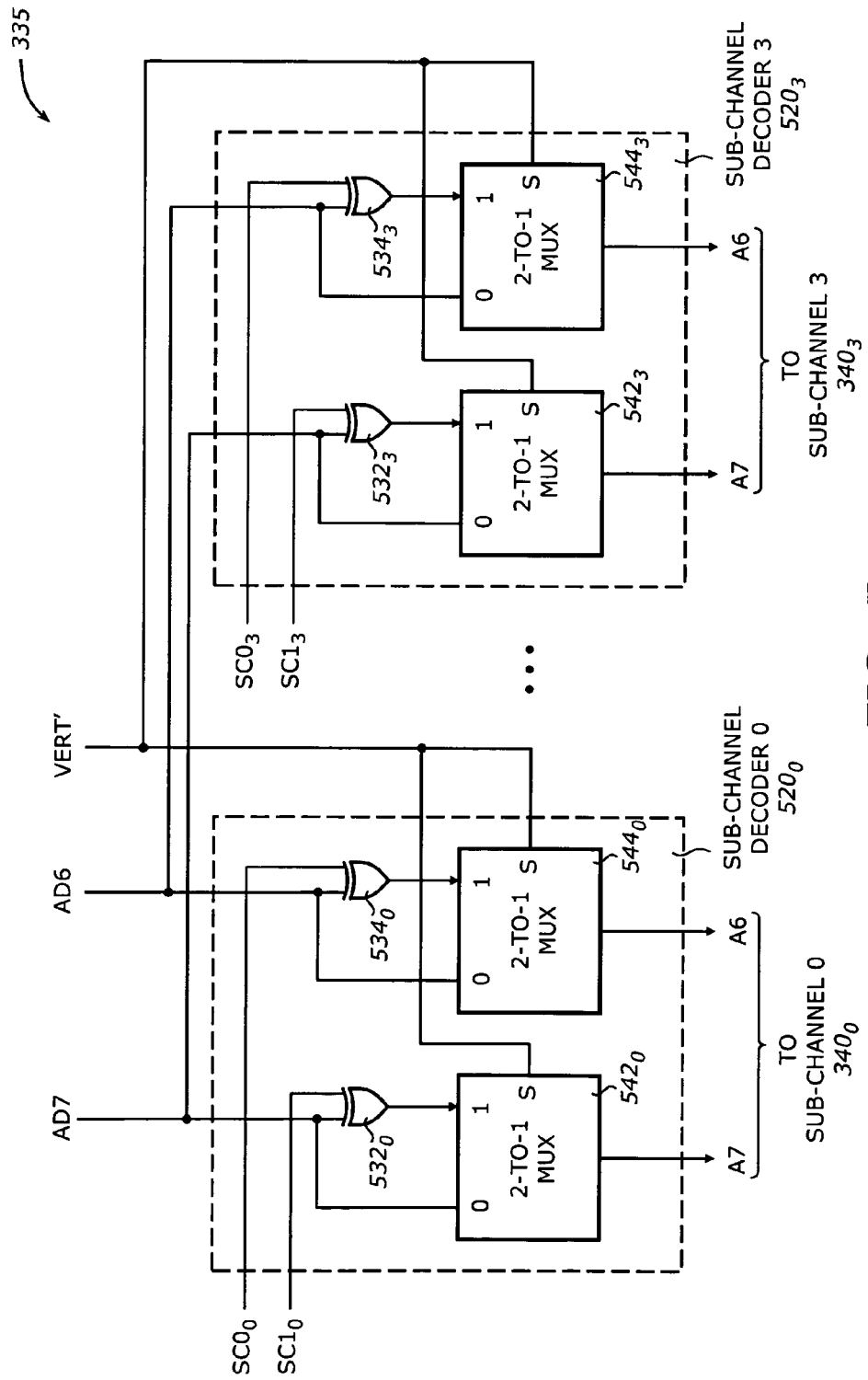
FIG. 5 is a diagram illustrating an address post-swizzle circuit according to one embodiment of the invention.

FIG. 3B is a diagram illustrating vertically tiled memory accesses using the access controller 75/125 according to one embodiment of the invention. For a vertically tiled transfer, both TILED and VERT are asserted. VERT', the output of the decoding circuit 320 is asserted. The address pre-swizzle circuit 330 places the column number to be accessed on address lines A7-A6. The address post-swizzle circuits $335_0$ to $335_3$ decode the address bits A7-A6 to generate the address bits A7-A6 to the individual sub-channels via the sub-channel interfaces $340_0$ to $340_3$. The circuits for the address pre-swizzle circuit 330 and address-post swizzle circuits $335_0$ to $335_3$ are shown in FIG. 4 and FIG. 5, respectively.

Figure 6A:
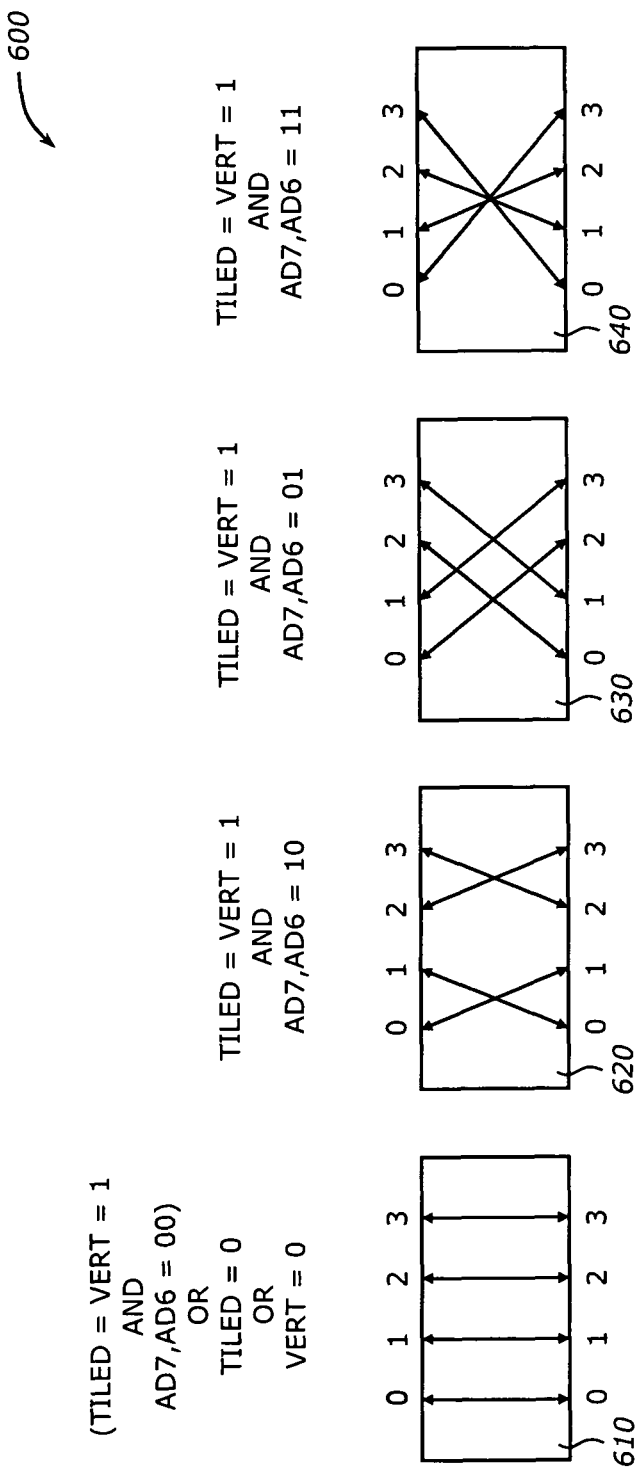
FIG. 6A is a diagram illustrating configurations of the data steering circuit according to one embodiment of the invention.

For a vertically tiled memory access, the VERT' signal and the address bits A7-A6 select one of four configurations for the data steering circuit 310. One of the four configurations corresponds to an identity permutation mapping. The other three configurations correspond to non-identity permutation mappings. Note that any other mappings may be used as long as they are different from the mapping used in the horizontally tiled memory access or untiled memory access. The four configurations of the data steering circuit 310 are shown in FIG. 6A.

The address pre-swizzle circuit 330 generates two address bits AD7-AD6 to the four sub-channels $340_0$ to $340_3$ to correspond to the four vertical addresses. The address bits A31-A8 are passed through and combined with the AD7-AD6 decoded by the address post-swizzle circuits $335_0$ to $335_3$ at each sub-channel to provide the complete address bits to the four sub-channels.

The data transfer 350 includes eight transfers. Each transfer corresponds to a vertical column of the tiled region of memory. The data transfers are routed through the data steering circuit 310 to correspond to the 64-byte transfer 360. The TILED signal selects access of the 64-byte transfer to be row-wise. That is, if the 64-byte transfer is considered to be an 8-by-8 array of bytes, and if the first row of the array is considered to be the first eight bytes of the transfer, the second row is considered to be the second eight bytes of the transfer, and so on, then a pair of such rows is routed to each sub-channel.

Figure 3C:
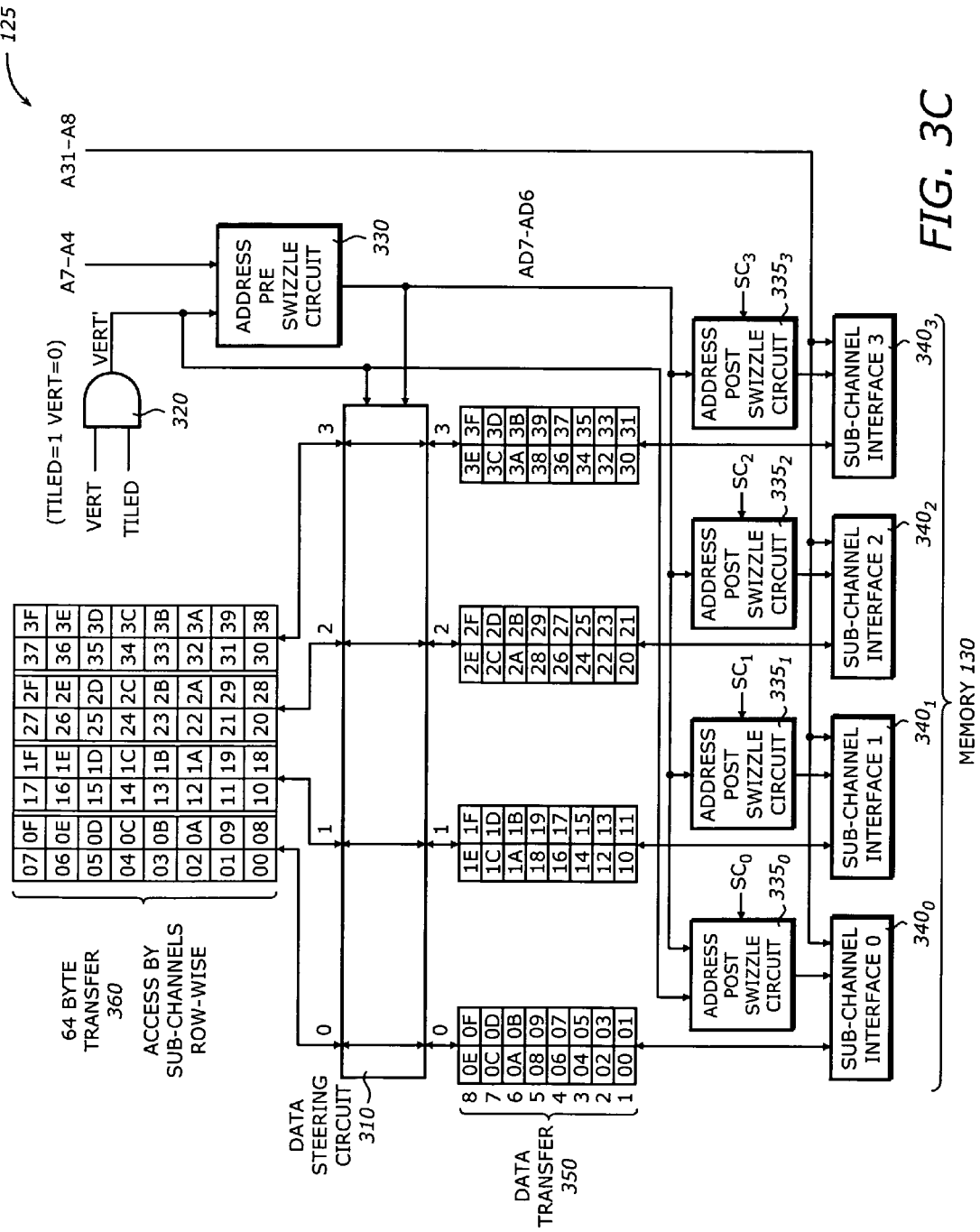
FIG. 3C is a diagram illustrating horizontally tiled memory accesses using an access controller according to one embodiment of the invention.

FIG. 3C is a diagram illustrating horizontally tiled memory accesses using the access controller 75/125 according to one embodiment of the invention. For a horizontally tiled transfer, VERT is negated or de-asserted. VERT', the output of the decoding circuit 320, is negated or de-asserted. The address pre-swizzle circuit 330 leaves the address bits A7-A6, indicating the tile row to be accessed, unchanged. The asserted VERT signal conditions the address post-swizzle circuits $335_0$ to $335_3$ to pass the address bits A7-A6 without change to the individual sub-channels via the sub-channel interfaces $340_0$ to $340_3$.

For a horizontally tiled memory access, the VERT' signal selects a first configuration for the data steering circuit 310. The first configuration corresponds to an identity permutation mapping. In the example shown in FIG. 3C, this identity permutation mapping maps port numbers 0, 1, 2, and 3 on the sub-channel side to the port numbers 0, 1, 2, and 3, respectively, on the processor side.

The data transfer 350 includes eight transfers. Each transfer corresponds to a horizontal row of the tiled region of memory. The data transfers are routed through the data steering circuit 310 to correspond to the 64-byte transfer 360. The TILED signal selects access of the 64-byte transfer to be row-wise. That is, if the 64-byte transfer is considered to be an 8-by-8 array of bytes, and if the first row of the array is considered to be the first eight bytes of the transfer, the second row is considered to be the second eight bytes of the transfer, and so on, then a pair of such rows is routed to each sub-channel.

Figure 3D:
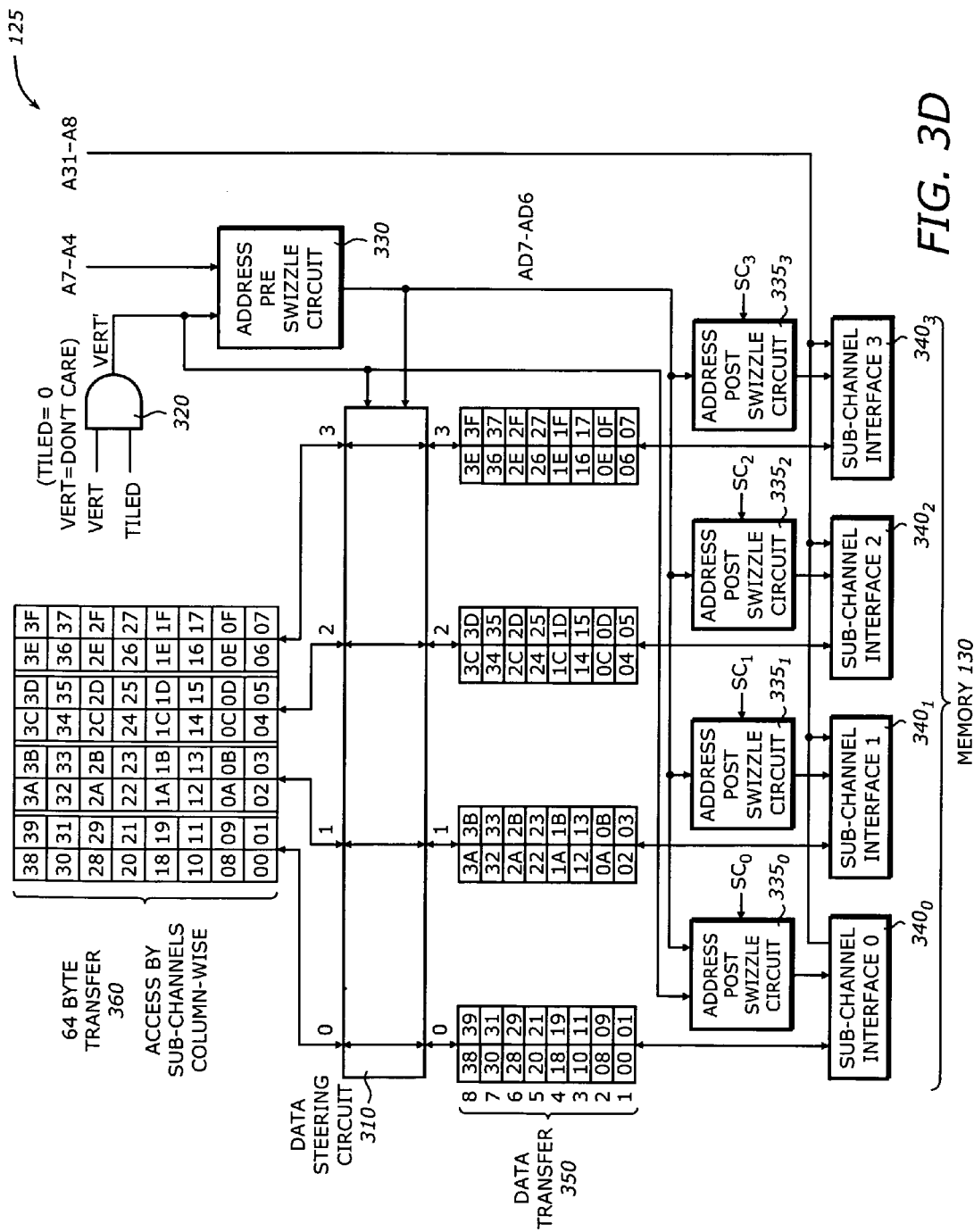
FIG. 3D is a diagram illustrating untiled memory accesses using an access controller according to one embodiment of the invention.

FIG. 3D is a diagram illustrating untiled memory accesses using the access controller 75/125 according to one embodiment of the invention. For an untiled transfer, TILED is negated or de-asserted. VERT', the output of the decoding circuit 320, is negated or de-asserted. The address pre-swizzle circuit 330 leaves the address bits A7-A6, indicating the tile row to be accessed, unchanged. The VERT signal conditions the address post-swizzle circuit $335_0$ to $335_3$ to pass the address bits A7-A6 without change to the individual sub-channels via the sub-channel interfaces $340_0$ to $340_3$.

For an untiled memory access, the VERT' signal selects a first configuration for the data steering circuit 310. The first configuration corresponds to an identity permutation mapping. In the example shown in FIG. 3D, this identity permutation mapping maps port numbers 0, 1, 2, and 3 on the sub-channel side to the port numbers 0, 1, 2, and 3, respectively, on the processor side.

The data transfer 350 includes eight transfers. Each transfer corresponds to a horizontal row of the tiled region of memory. The data transfers are routed through the data steering circuit 310 to correspond to the 64-byte transfer 360. The TILED signal selects access of the 64-byte transfer to be column-wise. That is, if the 64-byte transfer is considered to be an 8-by-8 array of bytes, and if the first row of the array is considered to be the first eight bytes of the transfer, the second row is considered to be the second eight bytes of the transfer, and so on, then a pair of columns from that array is routed to each sub-channel.

FIG. 4 is a diagram illustrating the address pre-swizzle circuit 330 shown in FIG. 3A according to one embodiment of the invention.

In essence, the address pre-swizzle circuit 330 includes a decoder to decode the least significant K common address bits to address bits AD7-AD6 corresponding to the address bits A7-A6, respectively based on the access control signals. For the illustrative example shown in FIG. 3A, the address pre-swizzle circuit 330 decodes the least significant 4 address bits of A31-A4 which includes four address bits A7-A4, and delivers the address bits AD7-AD6 to the address post-swizzle circuits $335_0$ to $335_3$.

The address pre-swizzle circuit 330 includes two two-to-one multiplexers 410 and 420. The inputs to the multiplexer 410 are the address bits A7 and A4. The inputs to the multiplexer 420 are the address bits A5 and A6. Both multiplexers are selected by the VERT' signal. When the VERT' signal is LOW, indicating that the memory access is an untiled memory access or a horizontally tiled access, the multiplexers 410 and 420 select the 0-inputs which correspond to A7 and A6, respectively. When the VERT' signal is HIGH, indicating that the memory access is a vertically tiled memory access, the multiplexers 410 and 420 select the 1-inputs which correspond to A4 and A5, respectively. The address pre-swizzle circuit 330, therefore, provides the address bits AD7-AD6 as A7-A6 or A4-A5 depending on whether the memory access is untiled or horizontally tiled access, or vertically tiled memory access.

FIG. 5 is a diagram illustrating the address post-swizzle circuit $335_i$ (i=0, . . . 3) shown in FIG. 3A according to one embodiment of the invention. In this embodiment, the sub-channel identifiers may be provided at the sub-channel interfaces $340_0$ to $340_3$. The sub-channel interfaces $340_0$ to $340_3$ may provide the sub-channel identifiers (e.g., SC1 and SC0 bits) locally at the interface circuit. The interface circuit may be internal or external to the MC 120. In other embodiments, the sub-channel identifiers may be provided in a configuration register as part of a configuration procedure during initialization or boot-up sequence.

The address post-swizzle circuit $335_i$ may include N sub-channel decoders $520_0$ to $520_{N-1}$ where N is the number of sub-channels. The N sub-channel decoders $520_0$ to $520_{N-1}$ are essentially the same. The inputs to each of the N sub-channel decoders $520_0$ to $520_{N-1}$ are the AD7-AD6 bits of the address pre-swizzle circuit 330 and the sub-channel identifier bits, i.e., the SC1 and SC0 at the corresponding sub-channel. The outputs of the N sub-channel decoders $520_0$ to $520_{N-1}$ are the address bits A7-A6 to be delivered to the memory devices of the sub-channels. For N=4, there are 4 groups of A7-A6 bits to be delivered to the memory devices of the sub-channels.

Each of the N sub-channel decoders generates K sub-channel address bits (e.g., A7-A6 bits) based on the access control signals (e.g., TILED, VERT) and the corresponding sub-channel identifier (e.g., SC1 and SC0), where $N=2^K$. For brevity, not all of the sub-channel decoders are shown. The sub-channel decoder $520_0$ includes two XOR gates $532_0$ and $534_0$ and two 2-to-1 multiplexers $542_0$ and $544_0$. The two XOR gates $532_0$ and $534_0$ perform-XOR operation on the AD7-AD6 bits and the sub-channel identifier bits $SC1_0$ and $SC0_0$ at the sub-channel 0. The inputs 0 to the multiplexer are the AD7-AD6 bits. The inputs 1 to the multiplexer 536 are the outputs of the XOR gates $532_0$ and $534_0$. In essence, the sub-channel decoder $520_0$ implements the logic functions provided by equations (2a) and (2b). The other sub-channel decoders have similar components. For example, the sub-channel decoder $520_3$ includes XOR gates $532_3$ and $534_3$ and 2-to-1 multiplexer $534_3$. It delivers the address A7-A6 to the sub-channel 3 $340_3$.

The VERT' signal is connected to the select inputs of all the multiplexers $542_0$ and $544_0$. When VERT' is negated or de-asserted, indicating that the memory access type is either a horizontally tiled memory access or an untiled memory access, the multiplexers $542_0$ and $544_0$ select the 0-inputs which are the AD7-AD6 address bits which in turn are the same as the original address bits A7-A6.

When VERT' is asserted, indicating that the memory access type is a vertically tiled memory access, the multiplexers $542_0$ and $544_0$ select the 1-inputs which correspond to the outputs of the XOR gates $532_0$, $534_0$, . . . , $532_3$, $534_3$. The XOR gates $532_0$, . . . , $534_3$ perform XOR operations between the sub-channel identifiers $SC1_0$, $SC0_0$, . . . , $SC1_3$, $SC0_3$ and the address bits AD7-AD6 which are the original address bits A4-A5, as provided by equations (2a) and (2b). Accordingly, the generated A7-A6 address bits, sent to the subchannels $340_0$ to $340_3$, correspond to the properly computed address bits for a vertically tiled memory access.

FIG. 6A is a diagram illustrating configurations 600 of the data steering circuit 310 according to one embodiment of the invention. The configurations 600 include configurations or mappings 610, 620, 630, and 640.

The data steering circuit 310 is interfaced to the data bus of the MC 120 to transfer data to and from the MC 120 to the processor unit 110. It connects to N sub-channels of memory to dynamically steer data for a memory access type including tiled and untiled memory accesses according to access control signals and sub-channel identifiers associated with the N sub-channels. The data steering circuit 310 may be organized as a switch network that connects N ports on the processor side to the N ports on the sub-channel side. As shown in FIG. 6A, these ports are numbered (0, 1, 2, 3). The switch configuration therefore may be considered as a mapping from one set of numbers representing the port numbers on one side to another set of numbers representing the port numbers on the other side. This mapping may be referred to as a permutation function.

The configuration 610 is a unity permutation where ports 0, 1, 2, and 3 on one side map to ports 0, 1, 2, and 3, respectively, on the other side. This configuration is used by the untiled memory accesses, horizontally tiled memory accesses, and vertically tiled memory accesses that have the address bits AD7 and AD6 equal to 0 and 0, respectively.

The configuration 620 is a non-unity permutation where ports 0, 1, 2, and 3 on one side map to ports 1, 0, 3, and 2, respectively, on the other side. This configuration is used by the vertically tiled memory accesses that have the address bits AD7 and AD6 equal to 1 and 0, respectively.

The configuration 630 is a non-unity permutation where ports 0, 1, 2, and 3 on one side map to ports 2, 3, 0, and 1, respectively, on the other side. This configuration is used by the vertically tiled memory accesses that have the address bits AD7 and AD6 equal to 0 and 1, respectively.

The configuration 640 is a non-unity permutation where ports 0, 1, 2, and 3 on one side map to ports 3, 2, 1, and 0, respectively, on the other side. This configuration is used by the vertically tiled memory accesses that have the address bits AD7 and AD6 equal to 1 and 1, respectively.

Figure 6B:
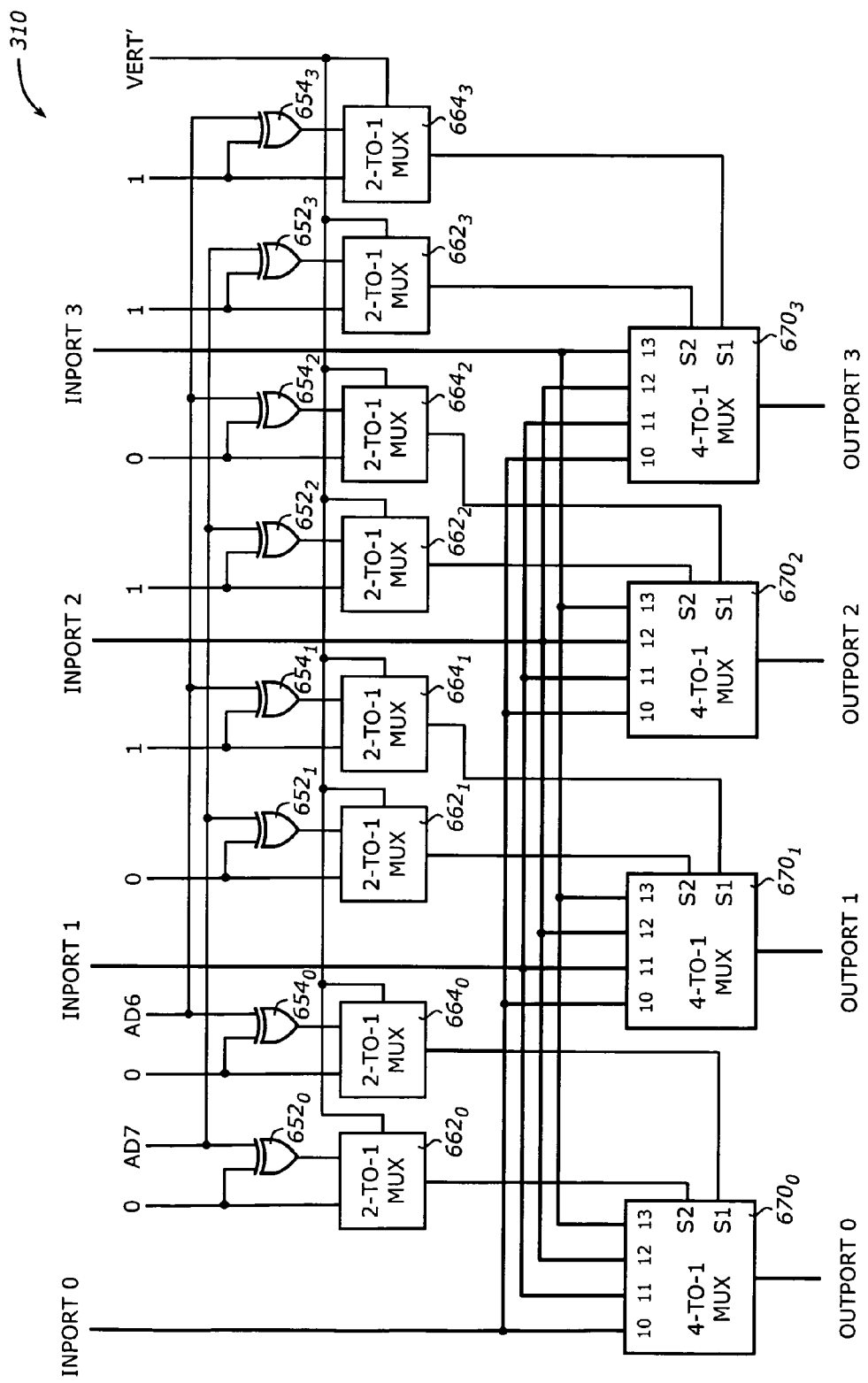
FIG. 6B is a diagram illustrating a data steering circuit according to one embodiment of the invention.

FIG. 6B is a diagram illustrating the data steering circuit 310 according to one embodiment of the invention. The data steering circuit 310 includes circuits for bi-directional transfers. For brevity, only the circuit for one direction is shown. In this circuit, the data transfer is from the inports 0, 1, 2, and 3 to the outports 0, 1, 2, and 3. When two of these circuits are used to provide bi-directional transfers, tri-state buffers may be used at the outports 0, 1, 2, and 3 and inports 0, 1, 2, and 3 as appropriate.

The data steering circuit 310 includes XORgates $652_0$, $654_0$, $652_1$, $654_1$, $652_2$, $654_2$, $652_3$, and $654_3$, 2-to-1 multiplexers $662_0$, $664_0$, $663_1$, $664_1$, $662_2$, $664_2$, $662_3$, and $664_3$, and 4-to-1 multiplexers $670_0$, $670_1$, $670_2$, and $670_3$. The XOR gates $652_0$, $654_0$, $652_1$, $654_1$, $652_2$, $654_2$, $652_3$, and $654_3$ perform XOR operations on the address bits AD7 and AD6 with the hard-coded sub-channel identifiers 00, 01, 10, and 11, respectively, The VERT signal is used to select the inputs of the 2-to-1 multiplexers $662_0$, $664_0$, $663_1$, $664_1$, $662_2$, $664_2$, $662_3$, and $664_3$. The outputs of the pairs of the 2-to-1 multiplexers $662_0$, $664_0$, $663_1$, $664_1$, $662_2$, $664_2$, $662_3$, and $664_3$ are used to select the inputs of the 4-to-1 multiplexers $670_0$, $670_1$, $670_2$, and $670_3$ as shown.

When the VERT' signal is LOW, indicating the memory access type is either untiled memory access or horizontally tiled memory access, the 2-to-1 multiplexers $662_0$, $664_0$, $663_1$, $664_1$, $662_2$, $664_2$, $662_3$, and $664_3$ select the sub-channel identifiers 00, 01, 10, and 11. When these outputs are used to select the 4-to-1 multiplexers $670_0$, $670_1$, $670_2$, and $670_3$, the result is that the outports 0, 1, 2, and 3 are mapped to the inports 0, 1, 2, and 3, respectively, corresponding to the unity permutation mapping.

When the VERT' signal is HIGH, indicating that the memory access type is a vertically tiled memory access, the 2-to-1 multiplexers $662_0$, $664_0$, $663_1$, $664_1$, $662_2$, $664_2$, $662_3$, and $664_3$ select the outputs of the XOR gates. The result of the mapping therefore depends on the values of the address bits AD7 and AD6.

When AD7-AD6=00, the outputs of the XOR gates are 00, 01, 10, and 11 which are the same as in the case where VERT' signal is LOW. Accordingly, the result is that for AD7-AD6=00, the outports 0, 1, 2, and 3 are mapped to the inports 0, 1, 2, and 3, respectively, corresponding to the unity permutation mapping as indicated in the configuration 610 shown in FIG. 6A.

When AD7-AD6=01, the outputs of the XOR gates are 01, 00, 11, and 10. Accordingly, the result is that for AD7-AD6=01, the outports 0, 1, 2, and 3 are mapped to the inports 1, 0, 3, and 2, respectively, corresponding to the configuration 620 shown in FIG. 6A.

When AD7-AD6=10, the outputs of the XOR gates are 10, 11, 00, and 01. Accordingly, the result is that for AD7-AD6=10, the outports 0, 1, 2, and 3 are mapped to the inports 2, 3, 0, and 1, respectively, corresponding to the configuration 630 shown in FIG. 6A.

When AD7-AD6=11, the outputs of the XOR gates are 11, 10, 01, and 00. Accordingly, the result is that for AD7-AD6=11, the outports 0, 1, 2, and 3 are mapped to the inports 3, 2, 1, and 0, respectively, corresponding to the configuration 640 shown in FIG. 6A.

Figure 7:
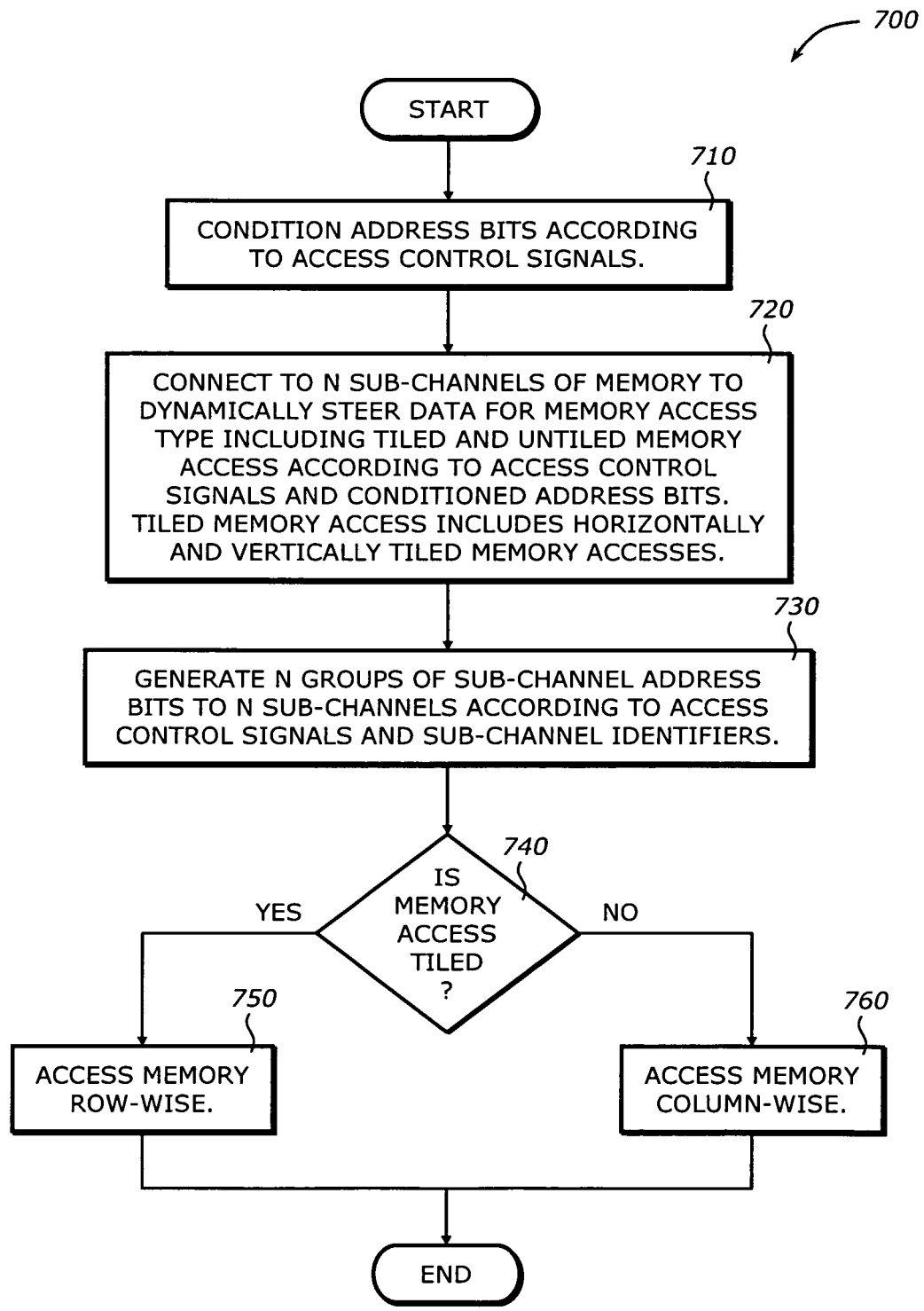
FIG. 7 is a flowchart illustrating a process to access memory according to one embodiment of the invention.

FIG. 7 is a flowchart illustrating a process 700 to access memory according to one embodiment of the invention. Note that the process 700 illustrates a read access. A write access may be similarly obtained.

Upon START, the process 700 conditions the address bits according to the access control signals (Block 710). The access control signals may include a tiled control signal to select the tiled memory access, and a vertical control signal to select the vertically tiled memory access when the TILED control signal is asserted. Next, the process 700 connects to N sub-channels of memory to dynamically steer data for a memory access type including tiled and untiled memory accesses according to access control signals and the conditioned address bits (Block 720). The tiled memory accesses include horizontally and vertically tiled memory accesses.

Then, the process 700 generates sub-channel address bits to the N sub-channels according to the access control signals and the sub-channel identifiers (Block 730).

Next, the process 700 determines if the memory access is tiled (Block 740). If so, the process 700 accesses the memory row-wise (Block 750) and is then terminated. Otherwise, the process 700 accesses the memory column-wise (Block 760) and is then terminated.

Figure 8:
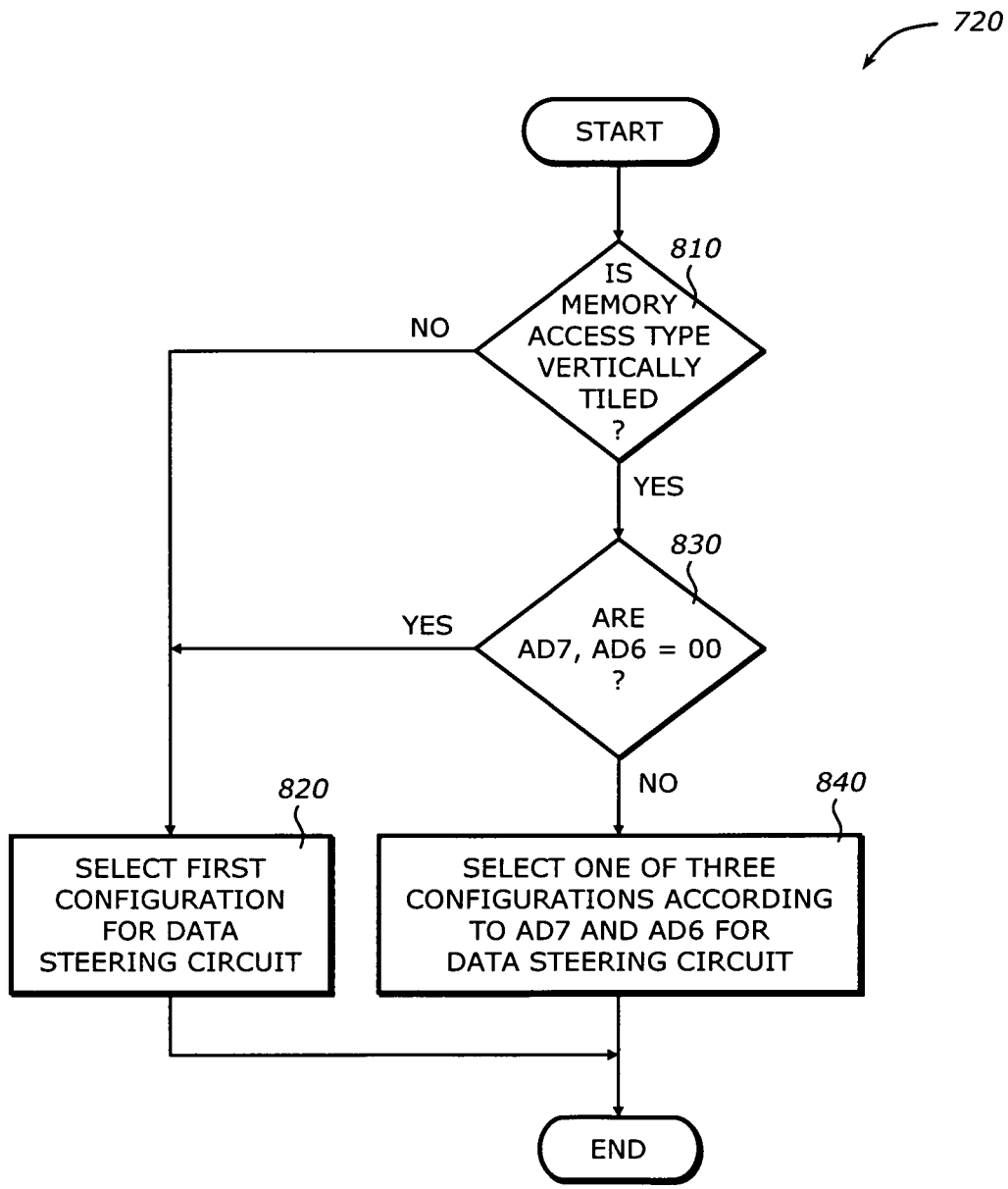
FIG. 8 is a flowchart illustrating a process to select a configuration for the data steering circuit according to one embodiment of the invention.

FIG. 8 is a flowchart illustrating the process 720 to select a configuration for the data steering circuit according to one embodiment of the invention.

Upon START, the process 720 determines if the memory access type is vertically tiled (Block 810). If not, the process 720 selects a first configuration for the data steering circuit (Block 820) and is then terminated. Otherwise, the process 720 determines if the conditioned address bits are 00 (Block 830). If so, the process 720 goes to Block 820. Otherwise, the process 720 selects one of the three configurations according to the conditioned address bits for the data steering circuit (Block 840) and is then terminated. Typically, the first configuration corresponds to an identity permutation mapping from ports on one side to ports on the other side. The other three configurations may correspond to non-identity permutation mappings.

Figure 9:
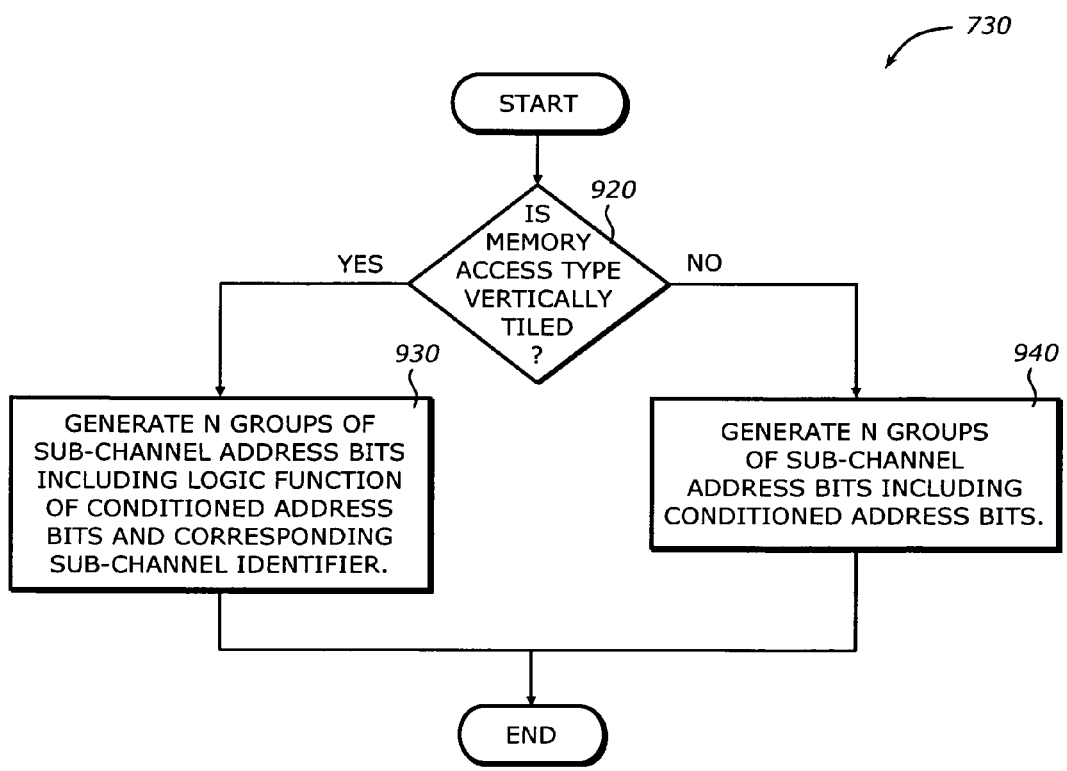
FIG. 9 is a flowchart illustrating a process to generate N groups of sub-channel address bits according to one embodiment of the invention.

FIG. 9 is a flowchart illustrating the process 730 shown in FIG. 7 to generate N groups of sub-channel address bits.

Upon START, the process 730 determines if the memory access type is vertically tiled (Block 920). If so, the process 730 generates the N groups of sub-channel address bits including a logic function of the conditioned address bits and the corresponding sub-channel identifier (Block 930) and is then terminated. Otherwise, the process 730 generates the N groups of sub-channel address bits including the conditioned address bits (Block 940) and is then terminated. In essence, when the access type is horizontally tiled or untiled memory access, the conditioned address bits sent to the sub-channels are the same original address bits at the same bit positions.

Elements of embodiments of the invention may be implemented by hardware, firmware, software or any combination thereof. The term hardware generally refers to an element having a physical structure such as electronic, electromagnetic, optical, electro-optical, mechanical, electromechanical parts, components, or devices, etc. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory). Examples of firmware may include microcode, writable control store, micro-programmed structure. When implemented in software or firmware, the elements of an embodiment of the present invention are essentially the code segments to perform the necessary tasks. The software/firmware may include the actual code to carry out the operations described in one embodiment of the invention, or code that emulates or simulates the operations. The program or code segments may be stored in a processor or machine accessible medium or transmitted by a computer data signal embodied in a carrier wave, or a signal modulated by a carrier, over a transmission medium. The "processor readable or accessible medium" or "machine readable or accessible medium" may include any medium that can store, transmit, or transfer information. Examples of the processor readable or machine accessible medium include an electronic circuit, a semiconductor memory device, a read only memory (ROM), a flash memory, an erasable ROM (EROM), an erasable programmable ROM (EPROM), a floppy diskette, a compact disk (CD) ROM, an optical disk, a hard disk, a fiber optic medium, a radio frequency (RF) link, etc. The machine accessible medium may be embodied in an article of manufacture. The machine accessible medium may include data that, when accessed by a machine, cause the machine to perform the operations described above. The machine accessible medium may also include program code embedded therein. The program code may include machine readable code to perform the operations described above.

All or part of an embodiment of the invention may be implemented by hardware, software, or firmware, or any combination thereof. The hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. An apparatus may include any combination of hardware, software, and firmware modules.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus for controlling vertically tiled, horizontally tiled and untiled memory access comprising:
   an address pre-swizzle circuit having swizzled and non swizzled operational states to produce, at an output of said address pre-swizzle circuit, conditioned address bits from address bits provided by a processor, one or the other of said output states being selected according to an access control signal that indicates: 1) vertically tiled memory access; or, 2) untiled or horizontally tiled memory access;
   a data steering circuit coupled to the output of the address pre-swizzle circuit, the data steering circuit to couple data to N sub-channels of memory by dynamically steering the data according to a selected one of different permutation mapping types, the selected one of the different permutation mapping types being selected as a function of the access control signal and the conditioned address bits from the output of the address pre-swizzle circuit, said different permutation mapping types corresponding to:
   i) untiled memory access with a first datapath and a first data unit orientation through said data steering circuit;
   ii) vertically tiled memory access with a second datapath and a second data unit orientation through said data steering circuit, said second data unit orientation being orthogonal to said first data unit orientation;
   iii) horizontally tiled memory access with said first datapath and said second data unit orientation through said data steering circuit;
   N respective address post-swizzle circuits coupled to the output of the address pre-swizzle circuit to generate N respective valid address bits from the conditioned address bits in response to the access control signal and sub channel identification information; and,
   N respective sub-channel interface circuits respectively coupled to the N respective address post-swizzle circuits and the data steering circuit, the sub-channel interface circuits to respectively generate sub-channel address bits and sub channel data for the N sub-channels.

2. The apparatus of claim 1 wherein the access control signal is derived from:
   a tiled control signal that indicates tiled memory access; and
   a vertical control signal that indicates vertically tiled memory access when the tiled control signal is asserted.

3. The apparatus of claim 1 wherein the address pre-swizzle circuit comprises:
   a data selector to select least significant common address bits.

4. The apparatus of claim 1 wherein the N respective address post-swizzle circuits generate N groups of sub-channel address bits with a logic function of the conditioned address bits from the output of the address pre-swizzle circuit and the sub-channel identification information when the memory access type is the vertically tiled memory accesses.

5. The apparatus of claim 1 wherein the N respective address post-swizzle circuits generate N groups of sub-channel address bits from the conditioned address bits from the output of the address pre-swizzle circuit when the memory access type is horizontally tiled memory access or untiled memory access.

6. The apparatus of claim 1 wherein said plurality of swizzling permutations include: a first swizzling permutation that swizzles neighboring positions; a second swizzling permutation that swizzles neighboring +1 positions.

7. A method for controlling memory access comprising:
   conditioning address bits provided by a processor according to an access control signal that indicates whether vertical or horizontal addressing applies, the conditioning including selecting between swizzled address bits and non swizzled address bits;
   coupling data to N sub-channels of memory by:
   dynamically steering the data by selecting one permutation mapping type amongst different permutation mapping types as a function of the access control signal and the conditioned address bits, the different type of permutation mapping types including:
   i) untiled memory access with a first datapath and a first data unit selection orientation;
   ii) vertically tiled memory access with a second datapath and a second data unit selection orientation that is orthogonal to said first data unit selection orientation;
   iii) horizontally tiled memory access with said first datapath and said second data unit selection orientation;
   receiving the conditioned address bits and receiving sub channel identification information and generating, in response thereto, N respective valid address bits from the received conditioned address bits; and,
   receiving the steered data and the valid address bits and generating respective sub-channel address and data bits for the N sub-channels.

8. The method of claim 7 wherein the access control signal is derived from a tiled control signal that indicates a tiled memory access, and a vertical control signal that indicates vertically tiled memory access when the tiled control signal is asserted.

9. The method of claim 7 wherein the generated sub-channel address bits are:
   K address bits, K being equal to $\log_2(N)$.

10. The method of claim 7 wherein generating the N respective address bits comprises:
    performing logic operations on the conditioned address bits and the sub-channel information when the memory access type is the vertically tiled memory accesses.

11. A system for controlling memory access comprising:
    a processor;
    a plurality of memory devices formed into N sub-channels of memory;
    a memory controller coupled to the processor and the plurality of memory devices, the memory controller including an access controller, the access controller comprising:

an address pre-swizzle circuit having swizzled and non swizzled operational states to produce, at an output of said address pre-swizzle circuit, conditioned address bits from address bits provided by the processor, one or the other of said output states being selected according to an access control signal that indicates: 1) vertically tiled memory access; or, 2) untiled or horizontally tiled memory access;

a data steering circuit coupled to the output of the address pre-swizzle circuit, the data steering circuit to couple data to N sub-channels of memory by dynamically steering the data according to a selected one of different permutation mapping types, the selected one of the different permutation mapping types being selected as a function of the access control signal and the conditioned address bits from the output of the address pre-swizzle circuit, said data steering circuitry designed to support:
  i) untiled memory access with a first datapath and a first data unit orientation through said data steering circuit;
  ii) vertically tiled memory access with a second datapath and a second data unit orientation through said data steering circuit, said second data unit orientation being orthogonal to said first data unit orientation;
  iii) horizontally tiled memory access with said first datapath and said second data unit orientation through said data steering circuit;

N respective address post-swizzle circuits coupled to the output of the address pre-swizzle circuit to generate N respective valid address bits from the conditioned address bits in response to the access control signal and sub channel identification information; and, N respective sub-channel interface circuits respectively coupled to the N respective address post-swizzle circuits and the data steering circuit, the sub-channel interface circuits to respectively generate sub-channel address bits and sub channel data for the N sub-channels.

12. The system of claim 11 wherein the access control signal is derived from:
  a tiled control signal that indicates tiled memory access; and
  a vertical control signal that indicates vertically tiled memory access when the tiled control signal is asserted.

13. The system of claim 11 wherein the address pre-swizzle circuit comprises:
  a data selector to select least significant common address bits.

14. The system of claim 13 wherein the N respective address post-swizzle circuits generate N groups of sub-channel address bits with a logic function of the conditioned address bits from the output of the address pre-swizzle circuit and the sub-channel identification information when the memory access type is the vertically tiled memory accesses.

15. The system of claim 13 wherein the N respective address post-swizzle circuits generate N groups of sub-channel address bits from the conditioned address bits from the output of the address pre-swizzle circuit when the memory access type is the horizontally tiled memory access or untiled memory access.

* * * * *